(12) United States Patent
Tomonaga et al.

(10) Patent No.: US 10,274,544 B2
(45) Date of Patent: Apr. 30, 2019

(54) ROUTE SWITCHING CIRCUIT AND VOLTAGE DETECTION DEVICE

(71) Applicant: DENSO CORPORATION, Kariya, Aichi-pref. (JP)

(72) Inventors: Yukihiro Tomonaga, Chiryu (JP); Tetsuya Makihara, Nukata-gun (JP); Kazutaka Honda, Chiryu (JP); Nobuyoshi Osamura, Nishio (JP); Ryotaro Miura, Nagoya (JP)

(73) Assignee: DENSO CORPORATION, Kariya (JP)

( * ) Notice: Subject to any disclaimer, the term of this patent is extended or adjusted under 35 U.S.C. 154(b) by 1017 days.

(21) Appl. No.: 14/445,383

(22) Filed: Jul. 29, 2014

(65) Prior Publication Data

US 2015/0054519 A1    Feb. 26, 2015

(30) Foreign Application Priority Data

Aug. 22, 2013  (JP) .................................. 2013-172280
Jun. 27, 2014  (JP) .................................. 2014-133083

(51) Int. Cl.
*G01R 31/36* (2019.01)

(52) U.S. Cl.
CPC ........ *G01R 31/3658* (2013.01); *G01R 31/362* (2013.01)

(58) Field of Classification Search
CPC .. G01R 31/3658; G01R 31/362; H02J 7/0019
USPC ........ 324/434, 426, 429, 433; 320/119, 121, 320/165; 361/245, 246; 327/58, 62, 63, 327/69, 70, 82, 85; 307/127, 138; 702/63
See application file for complete search history.

(56) References Cited

U.S. PATENT DOCUMENTS

| | | | | |
|---|---|---|---|---|
| 6,329,792 B1* | 12/2001 | Dunn | ................. | G01R 31/3658 320/130 |
| 8,154,253 B2* | 4/2012 | Omagari | ............ | G01R 31/3624 320/116 |
| 8,786,289 B2* | 7/2014 | Sekiguchi | ............ | G01R 31/362 320/116 |
| 2008/0265901 A1* | 10/2008 | Shimizu | ............. | G01R 19/2503 324/434 |
| 2008/0272791 A1* | 11/2008 | Hartzog | ............. | G01R 31/3658 324/434 |

(Continued)

FOREIGN PATENT DOCUMENTS

JP          2013-24800 A       2/2013

*Primary Examiner* — Drew A Dunn
*Assistant Examiner* — Harry O'Neill-Becerril
(74) *Attorney, Agent, or Firm* — Posz Law Group, PLC

(57) ABSTRACT

A route switching circuit includes: a pair of normal detection routes that output voltages of a positive side connection point and a negative side connection point, which are different from each other, in multiple batteries for constituting an assembled battery; and a pair of diagnosis detection routes that output the voltages of the positive side connection point and the negative side connection point, and confirm a connection state of the normal detection routes by using the normal detection routes, which output at least one of a voltage of a positive side battery connected to a positive side from the positive side connection point and a voltage of a negative side battery connected to a negative side from the negative side connection point.

15 Claims, 18 Drawing Sheets

(56) References Cited

U.S. PATENT DOCUMENTS

| | | | |
|---|---|---|---|
| 2009/0058505 A1* | 3/2009 | Yoshio | H01M 10/425 327/535 |
| 2010/0052656 A1* | 3/2010 | Tanaka | G01R 19/16542 324/123 R |
| 2010/0134068 A1* | 6/2010 | Lim | H02J 7/0016 320/116 |
| 2012/0139545 A1* | 6/2012 | Makihara | G01R 31/3658 324/426 |
| 2012/0175953 A1* | 7/2012 | Ohkawa | B60L 3/0046 307/18 |

* cited by examiner

ROUTE SWITCHING CIRCUIT AND VOLTAGE DETECTION DEVICE

CROSS REFERENCE TO RELATED APPLICATIONS

This application is based on Japanese Patent Applications No. 2013-172280 filed on Aug. 22, 2013, and No. 2014-133083 filed on Jun. 27, 2014, the disclosures of which are incorporated herein by reference.

TECHNICAL FIELD

The present disclosure relates to a route switching circuit and a voltage detection device which are configured to detect a voltage of each battery of an assembled battery that is constituted by connecting a plurality of batteries in series.

BACKGROUND

In the related art, a voltage detection device, which detects a voltage of each battery of an assembled battery that is constituted by connecting a plurality of batteries in series, is known. The voltage detection device includes a battery switching circuit and a voltage detection circuit. The battery switching circuit selects any one of the plurality of batteries that constitute the assembled battery, and outputs a voltage of the battery that is selected. The voltage detection circuit detects a voltage output from the battery switching circuit.

In addition, a voltage detection device, which includes two battery switching circuits and two voltage detection circuits in correspondence with one assembled battery, is known (for example, refer to Patent document No. 1). In the voltage detection device, a voltage of each battery, which constitutes the one assembled battery, is detected by using a first battery switching circuit and a first voltage detection circuit, and is also detected by using a second battery switching circuit and a second voltage detection circuit. That is, in the voltage detection device, in a case where voltage detection results are different from each other between the first voltage detection circuit and the second voltage detection circuit, it can be determined that abnormality occurs in the voltage detection device.

However, in the voltage detection device described in Patent document No. 1, the voltage is detected by both of the first voltage detection circuit and the second voltage detection circuit, and thus two battery switching circuits are provided. Therefore, there is a problem that the number of components that constitute the voltage detection device increases.

[Patent document No. 1] JP-A-2013-24800

SUMMARY

It is an object of the present disclosure to provide a route switching circuit and a voltage detection device which are configured to detect a voltage of each battery of an assembled battery that is constituted by connecting a plurality of batteries in series. In the route switching circuit and the voltage detection device, the number of components that constitute the voltage detection device is reduced.

According to a first aspect of the present disclosure, a route switching circuit includes: a pair of normal detection routes that output a voltage of a positive side connection point and a voltage of a negative side connection point, which are different from each other, in a plurality of batteries for constituting an assembled battery; and a pair of diagnosis detection routes that output the voltage of the positive side connection point and the voltage of the negative side connection point, and confirm a connection state of the normal detection routes by using the normal detection routes, which output at least one of a voltage of a positive side battery connected to a positive side from the positive side connection point and a voltage of a negative side battery connected to a negative side from the negative side connection point.

In the route switching circuit of the present disclosure which is configured as described above, a voltage between the positive side connection point and the negative side connection point can be detected by using the pair of normal detection routes and the pair of diagnosis detection routes. According to this, in a case where voltage detection results are different between the normal detection route and the diagnosis detection route, it can be determined that abnormality occurs in the route switching circuit.

In addition, the pair of diagnosis detection routes is provided by using a normal detection route that is provided to output a voltage of a battery that is adjacent to the positive side connection point and the negative side connection point. That is, the pair of diagnosis detection routes is commonly used in detection of voltages of adjacent batteries.

Accordingly, according to the route switching circuit of the present disclosure, the number of components that constitute the route switching circuit can be reduced as much as the voltage detection route that is commonly used in a case of detecting the voltage of batteries adjacent to each other.

Alternatively, the pair of normal detection routes may include: a positive side normal detection route that outputs the voltage of the positive side connection point; and a negative side normal detection route that outputs the voltage of the negative side connection point. The pair of diagnosis detection routes may include: a positive side diagnosis detection route that outputs the voltage of the positive side connection point, and a negative side diagnosis detection route that outputs the voltage of the negative side connection point. The route switching circuit further includes: an adjacent normal detection route that outputs a voltage of an adjacent negative side connection point arranged on a negative side from the negative side connection point in the assembled battery, and a switching unit that selects any one of a first connection state, a second connection state, and a third connection state, and switches the connection state. A connection state, in which voltages are output from the positive side normal detection route and the negative side normal detection route, and a voltage is not output from the positive side diagnosis detection route, the negative side diagnosis detection route, and the adjacent normal detection route, is set as the first connection state. A connection state, in which voltages are output from the positive side diagnosis detection route and the negative side diagnosis detection route, and a voltage is not output from the positive side normal detection route, the negative side normal detection route, and the adjacent normal detection route, is set as the second connection state. A connection state, in which voltages are output from the negative side diagnosis detection route and the adjacent normal detection route, and a voltage is not output from the positive side diagnosis detection route, the positive side normal detection route, and the negative side normal detection route, is set as the third connection state.

According to the route switching circuit of the present disclosure which is configured as described, the negative side diagnosis detection route can be used, which is used to detect the voltage between the positive side connection point and the negative side connection point, for detection of a voltage between the negative side connection point and the adjacent negative side connection point.

According to a second aspect of the present disclosure, a voltage detection device includes: the route switching circuit according to the first aspect; a voltage detection unit including a first conversion input unit and a second conversion input unit, in each of which different voltages output from the route switching circuit are input, respectively, and outputting a voltage corresponding to a difference between a voltage input to the first conversion input unit and a voltage input to the second conversion input unit; and a polarity inverting unit that inverts a polarity of a voltage output from the voltage detection unit between the first connection state and the second connection state.

In the voltage detection device of the present disclosure which is configured as described above, a voltage between the positive side connection point and the negative side connection point can be detected by using the pair of normal detection routes and the pair of diagnosis detection routes. According to this, in a case where voltage detection results are different between the normal detection route and the diagnosis detection route, it can be determined that abnormality occurs in the route switching circuit.

In addition, the pair of diagnosis detection routes is provided by using a normal detection route that is provided to output a voltage of a battery that is adjacent to the positive side connection point and the negative side connection point. That is, the pair of diagnosis detection routes is commonly used in detection of voltages of adjacent batteries.

Accordingly, according to the voltage detection device of the present disclosure, the number of components that constitute the route switching circuit can be reduced as much as the voltage detection route that is commonly used in a case of detecting the voltage of batteries adjacent to each other.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION (First Embodiment)

Hereinafter, a first embodiment of the present disclosure will be described with reference to the attached drawings.

Figure 1:
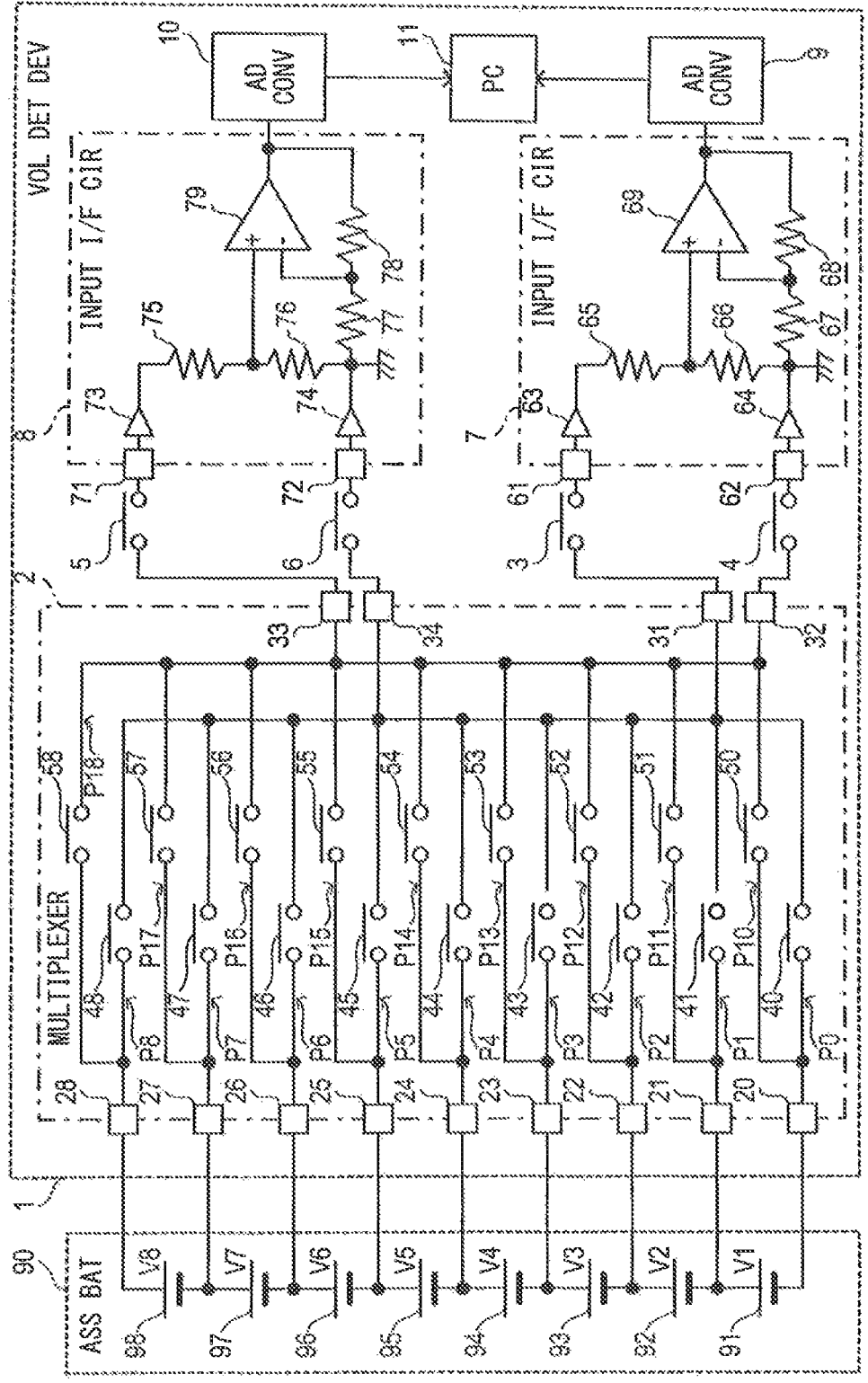
FIG. 1 is a circuit diagram illustrating a configuration of a voltage detection device.

As shown in FIG. 1, the voltage detection device 1 of this embodiment detects a voltage of an assembled battery 90.

The assembled battery 90 is constituted by connecting a plurality of batteries in series, and includes batteries 91, 92, 93, 94, 95, 96, 97, and 98 in this embodiment. In addition, the batteries 91 to 98 are connected in series in such a manner that positive electrodes of the batteries 91, 92, 93, 94, 95, 96, and 97 are connected to negative electrodes of the batteries 92, 93, 94, 95, 96, 97, and 98, respectively. Hereinafter, voltages of the batteries 91, 92, 93, 94, 95, 96, 97, and 98 are referred to as voltages V1, V2, V3, V4, V5, V6, V7, and V8, respectively.

The voltage detection device 1 includes a multiplexer 2, switches 3, 4, 5, and 6, input I/F circuits 7 and 8, AD converters 9 and 10, and a microcomputer 11.

The multiplexer 2 includes energizing routes P0, P1, P2, P3, P4, P5, P6, P7, and P8, energizing routes P10, P11, P12, P13, P14, P15, P16, P17, and P18, voltage input terminals 20, 21, 22, 23, 24, 25, 26, 27, and 28, voltage output terminals 31, 32, 33, and 34, switches 40, 41, 42, 43, 44, 45, 46, 47, and 48, and switches 50, 51, 52, 53, 54, 55, 56, 57, and 58.

The voltage input terminal 20 is connected to a negative electrode of the battery 91. In addition, the voltage input terminals 21, 22, 23, 24, 25, 26, 27, and 28 are connected to positive electrodes of the batteries 91, 92, 93, 94, 95, 96, 97, and 98, respectively.

The energizing route P0 is formed to connect the voltage input terminal 20 and the output terminals 31 and 34 to each other. Similarly, the energizing routes P1, P2, P3, P4, P5, P6, P7, and P8 are formed to connect the voltage input terminals 21, 22, 23, 24, 25, 26, 27, and 28, and the output terminals 31 and 34 to each other.

The energizing route P10 is formed to connect the voltage input terminal 20 and the output terminals 32 and 33 to each other. Similarly, the energizing routes P11, P12, P13, P14, P15, P16, P17, and P18 are formed to connect the voltage input terminals 21, 22, 23, 24, 25, 26, 27, and 28, and the output terminals 32 and 33 to each other.

The switches 40, 41, 42, 43, 44, 45, 46, 47, and 48 are provided to the energizing routes P0, P1, P2, P3, P4, P5, P6, P7, and P8, respectively, and operate to realize any state between an on-state in which the energizing routes are set up and an off-state in which the energizing routes are cut off.

The switches 50, 51, 52, 53, 54, 55, 56, 57, and 58 are provided to the energizing routes P10, P11, P12, P13, P14, P15, P16, P17, and P18, respectively, and operate to realize any state between an on-state in which the energizing routes are set up and an off-state in which the energizing routes are cut off.

The switches 3 and 4 are provided to energizing routes that reach the input I/F circuit 7 from the voltage output terminals 31 and 32, respectively, and the switches 5 and 6 are provided to energizing routes that reach the input I/F circuit 8 from the voltage output terminals 33 and 34, respectively. In addition, the switches 3, 4, 5, and 6 operate to realize any state between an on-state in which the energizing routes are set up and an off-state in which the energizing routes are cut off.

The input I/F circuit 7 is a circuit which differentially amplifies signals input from the voltage output terminals 31 and 32 of the multiplexer 2 and which outputs the resultant amplified signals to the AD converter 9. The input I/F circuit 7 includes voltage input terminals 61 and 62, buffers 63 and 64, resistors 65, 66, 67, and 68, and an operational amplifier 69.

The voltage input terminals 61 and 62 are connected to the voltage output terminals 31 and 32 through the switches 3 and 4, respectively.

The buffers 63 and 64 are circuits for impedance conversion, and input terminals of the buffers 63 and 64 are connected to the voltage input terminals 61 and 62, respectively.

One end of the resistor 65 is connected to an output terminal of the buffer 63, and the other end of the resistor 65 is connected to one end of the resistor 66. In addition, the other end of the resistor 66 is connected to an output terminal of the buffer 64. In addition, one end of the resistor 67 is connected to the output terminal of the buffer 64, and the other end of the resistor 67 is connected to one end of the resistor 68. In addition, the other end of the resistor 68 is connected to an output terminal of the operational amplifier 69. In addition, a connection point between the output terminal of the buffer 64, the resistor 66, and the resistor 67 is grounded.

In the operational amplifier 69, a non-inverting input terminal is connected to a connection point between the resistor 65 and the resistor 66, and an inverting input terminal is connected to a connection point between the resistor 67 and the resistor 68. In addition, the output terminal of the operational amplifier 69 is connected to the AD converter 9.

The input I/F circuit 8 is a circuit which differentially amplifies signals input from the voltage output terminals 33 and 34 of the multiplexer 2 and which outputs the resultant amplified signals to the AD converter 10. The input I/F circuit 8 includes voltage input terminals 71 and 72, buffers 73 and 74, resistors 75, 76, 77, and 78, and an operational amplifier 79, and is configured similar to the input I/F circuit 7.

The AD converters 9 and 10 convert voltage values of analog signals output from the input I/F circuits 7 and 8 to digital signals, and output the digital signals to the microcomputer 11.

The microcomputer 11 is constituted by a CPU, a ROM, a RAM, an I/O, a bus line that connects these components to each other, and the like, and controls operations of the switches 40 to 48, and 50 to 58 which constitute the multiplexer 2, and monitors the state of the batteries 91 and 98 on the basis of the digital signals output from the AD converters 9 and 10.

Next, in the voltage detection device 1 constituted as described above, a sequence of detecting the voltage of the batteries 91 to 98 will be described.

Figure 2:
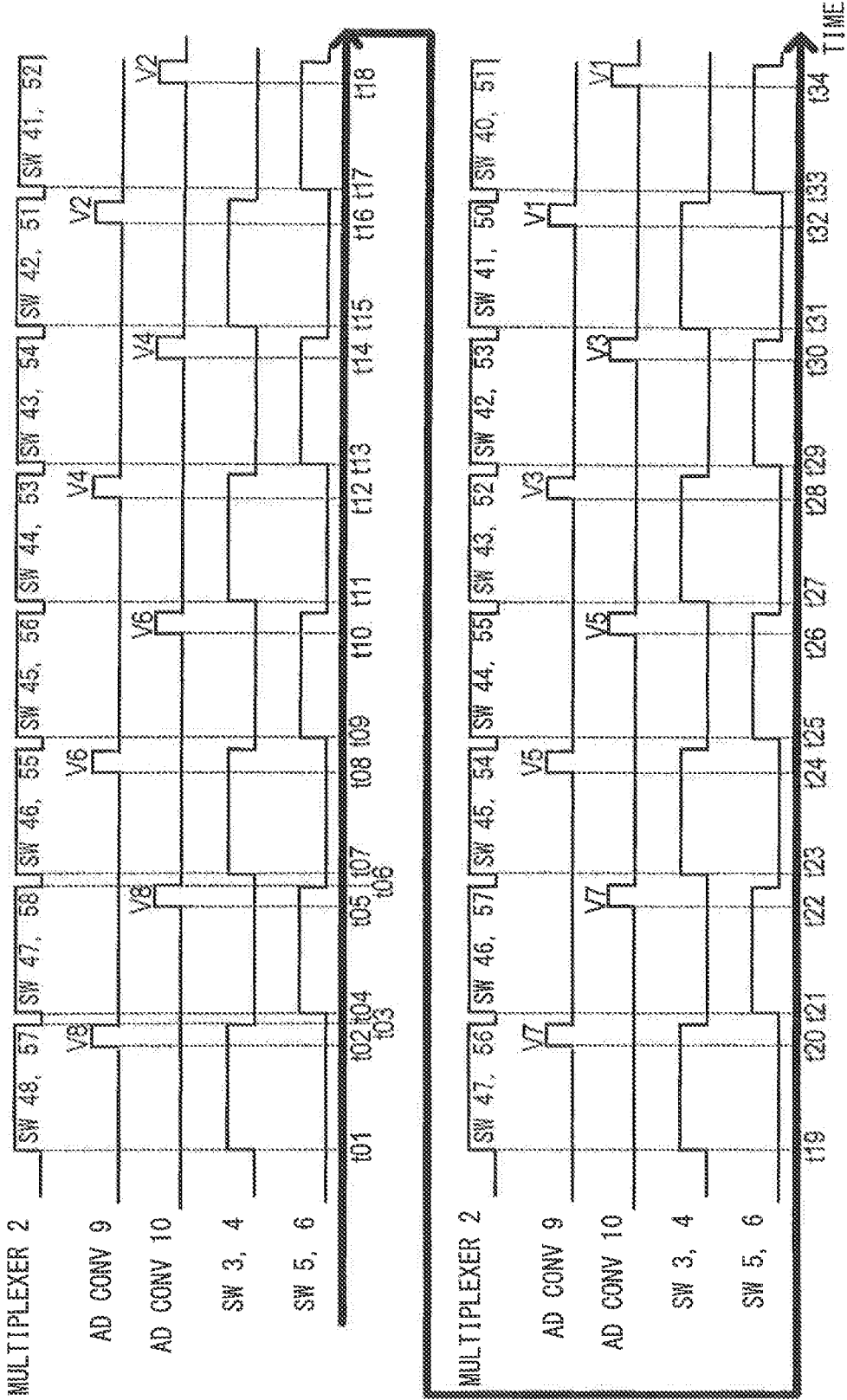
FIG. 2 is a timing chart illustrating a sequence of voltage detection carried out by a voltage detection device.

As shown in FIG. 2, first, the microcomputer 11 turns on the switches 48 and 57, and the switches 3 and 4 (refer to time t01). According to this, a voltage of the positive electrode of the battery 98 is input from the voltage output terminal 31 to the input I/F circuit 7 via the energizing route P8 that reaches the voltage output terminal 31 from the voltage input terminal 28 through the switch 48. In addition, a voltage of the negative electrode of the battery 98 is input from the voltage output terminal 32 to the input I/F circuit 7 via the energizing route P17 that reaches the voltage output terminal 32 from the voltage input terminal 27 through the switch 57. In addition, in this state, the microcomputer 11 acquires an output signal transmitted from the AD converter 9 (refer to time t02). According to this, the microcomputer 11 acquires information indicating the voltage V8 of the battery 98. Then, the switches 48 and 57, and the switches 3 and 4 are turned off (refer to time t03).

Next, the microcomputer 11 turns on the switches 47 and 58, and the switches 5 and 6 (refer to time t04). According to this, a voltage of the positive electrode of the battery 98 is input from the voltage output terminal 33 to the input I/F circuit 8 via the energizing route P18 that reaches the voltage output terminal 33 from the voltage input terminal 28 through the switch 58. In addition, a voltage of the negative electrode of the battery 98 is input from the voltage output terminal 34 to the input I/F circuit 8 via the energizing route P7 that reaches the voltage output terminal 34 from the voltage input terminal 27 through the switch 47. In addition, in this state, the microcomputer 11 acquires an output signal transmitted from the AD converter 10 (refer to time t05). According to this, the microcomputer 11 acquires information indicating the voltage V8 of the battery 98. Then, the switches 47 and 58, and the switches 5 and 6 are turned off (refer to time t06).

In this sequence, the voltage V8 of the battery 98 is detected by both of the input I/F circuit 7 and the input I/F circuit 8. In addition, the same sequence executed with respect to the battery 98 is sequentially executed in the order of the battery 96, the battery 94, the battery 92, the battery 97, the battery 95, the battery 93, and the battery 91.

Specifically, first, the switches 46 and 55, and the switches 3 and 4 are turned on (refer to time t07), and the voltage V6 of the battery 96 is detected by using the input I/F circuit 7 and the AD converter 9 (refer to time t08). Then, the switches 45 and 56, and the switches 5 and 6 are turned on (refer to time t09), and the voltage V6 of the battery 96 is detected by using the input I/F circuit 8 and the AD converter 10 (refer to time t10).

Next, the switches 44 and 53 and the switches 3 and 4 are turned on (refer to time t11), and the voltage V4 of the battery 94 is detected by using the input I/F circuit 7 and the AD converter 9 (refer to time t12). Then, the switches 43 and 54, and the switches 5 and 6 are turned on (refer to time t13), and the voltage V4 of the battery 94 is detected by using the input I/F circuit 8 and the AD converter 10 (refer to time t14).

Next, the switches 42 and 51, and the switches 3 and 4 are turned on (refer to time t15), and the voltage V2 of the battery 92 is detected by using the input I/F circuit 7 and the AD converter 9 (refer to time t16). Then, the switches 41 and 52, and the switches 5 and 6 are turned on (refer to time t17), and the voltage V2 of the battery 92 is detected by using the input I/F circuit 8 and the AD converter 10 (refer to time t18).

Next, the switches 47 and 56, and the switches 3 and 4 are turned on (refer to time t19), and the voltage V7 of the battery 97 is detected by using the input I/F circuit 7 and the AD converter 9 (refer to time t20). Then, the switches 46 and 57, and the switches 5 and 6 are turned on (refer to time t21), and the voltage V7 of the battery 97 is detected by using the input I/F circuit 8 and the AD converter 10 (refer to time t22).

Next, the switches 45 and 54, and the switches 3 and 4 are turned on (refer to time t23), and the voltage V5 of the battery 95 is detected by using the input I/F circuit 7 and the AD converter 9 (refer to time t24). Then, the switches 44 and 55, and the switches 5 and 6 are turned on (refer to time t25), and the voltage V5 of the battery 95 is detected by using the input I/F circuit 8 and the AD converter 10 (refer to time t26).

Next, the switches 43 and 52, and the switches 3 and 4 are turned on (refer to time t27), and the voltage V3 of the battery 93 is detected by using the input I/F circuit 7 and the AD converter 9 (refer to time t28). Then, the switches 42 and 53, and the switches 5 and 6 are turned on (refer to time t29), and the voltage V3 of the battery 93 is detected by using the input I/F circuit 8 and the AD converter 10 (refer to time t30).

Next, the switches 41 and 50, and the switches 3 and 4 are turned on (refer to time t31), and the voltage V1 of the battery 91 is detected by using the input I/F circuit 7 and the AD converter 9 (refer to time t32). Then, the switches 40 and 51, and the switches 5 and 6 are turned on (refer to time t33), and the voltage V1 of the battery 91 is detected by using the input I/F circuit 8 and the AD converter 10 (refer to time t34).

The voltage detection device 1 configured as described above includes the energizing routes P18, P8, P17, P7, P16, and P6, the input I/F circuit 7, the input I/F circuit 8, the switches 58, 48, 57, 47, 56, and 46, the switches 3, 4, 5, and 6, and the microcomputer 11.

The energizing routes P18 and P8 are connected to the positive electrode of the battery 98 in the batteries 98 and 97 which are connected in series. The energizing routes P17 and P7 are connected to a connection point between the negative electrode of the battery 98 and the positive electrode of the battery 97. The energizing route P16 and P6 are connected to the negative electrode of the battery 97.

In addition, the input I/F circuit 7 includes the voltage input terminals 61 and 62, and detects a difference between a voltage input to the voltage input terminal 61 and a voltage input to the voltage input terminal 62. The input I/F circuit 8 includes the voltage input terminals 71 and 72, and detects a difference between a voltage input to the voltage input terminal 71 and a voltage input to the voltage input terminal 72.

In addition, the microcomputer 11 selects any one of a first connection state, a second connection state, a third connection state, and a fourth connection state by the switches 58, 48, 57, 47, 56, and 46, and the switches 3, 4, 5, and 6, and switches the connection state. In addition, the first connection state represents a state in which the energizing route P8 and the energizing route P17 are connected to the voltage input terminal 61 and the voltage input terminal 62, respectively. The second connection state represents a state in which the energizing route P18 and the energizing route P7 are connected to the voltage input terminal 71 and the voltage input terminal 72, respectively. The third connection state represents a state in which the energizing route P7 and the energizing route P16 are connected to the voltage input terminal 61 and the voltage input terminal 62, respectively. The fourth connection state represents a state in which the energizing route P17 and the energizing route P6 are connected to the voltage input terminal 71 and the voltage input terminal 72, respectively.

In the voltage detection device 1 configured as described above, when the microcomputer 11 switches the connection state to the first connection state, the positive electrode of the battery 98 and the voltage input terminal 61 of the input I/F circuit 7 are connected to each other through the energizing route P8, and the negative electrode of the battery 98 and the voltage input terminal 62 of the input I/F circuit 7 are connected to each other through the energizing route P17. According to this, the input I/F circuit 7 can detect the voltage of the battery 98.

In addition, when the microcomputer 11 switches the connection state to the second connection state, the positive electrode of the battery 98 and the voltage input terminal 71 of the input I/F circuit 8 are connected to each other through the energizing route P18, and the negative electrode of the battery 98 and the voltage input terminal 72 of the input I/F circuit 8 are connected to each other through the energizing route P7. According to this, the input I/F circuit 8 can detect the voltage of the battery 98.

In addition, when the microcomputer 11 switches the connection state to the third connection state, the positive electrode of the battery 97 and the voltage input terminal 61 of the input I/F circuit 7 are connected to each other through the energizing route P7, and the negative electrode of the battery 97 and the voltage input terminal 62 of the input I/F circuit 7 are connected to each other through the energizing route P16. According to this, the input I/F circuit 7 can detect the voltage of the battery 97.

In addition, when the microcomputer 11 switches the connection state to the fourth connection state, the positive electrode of the battery 97 and the voltage input terminal 71 of the input I/F circuit 8 are connected to each other through the energizing route P17, and the negative electrode of the battery 97 and the voltage input terminal 72 of the input I/F circuit 8 are connected to each other through the energizing route P6. According to this, the input I/F circuit 8 can detect the voltage of the battery 97.

As described above, the energizing routes, which are used in a case where the input I/F circuit 7 detects the voltage of the battery 98, are the energizing routes P8 and P17, and the energizing routes, which are used in a case where the input I/F circuit 8 detects the voltage of the battery 98, are the energizing routes P18 and P7. That is, the energizing routes, which are used in a case of detecting the voltage of the battery 98, are different between the input I/F circuit 7 and the input I/F circuit 8. Similarly, the energizing routes, which are used in a case of detecting the voltage of the battery 97, are different between the input I/F circuit 7 and the input I/F circuit 8. According to this, in a case where voltage detection results are different between the input I/F circuit 7 and the input I/F circuit 8, it can be determined that abnormality occurs in the voltage detection device 1.

Furthermore, the energizing route P17 is used in a case where the input I/F circuit 7 detects the voltage of the battery 98, and in a case where the input I/F circuit 8 detects the voltage of the battery 97. In addition, the energizing route P7 is used in a case where the input I/F circuit 7 detects the voltage of the battery 97, and in a case where the input I/F circuit 8 detects the voltage of the battery 98. That is, the energizing routes P17 and P7 are commonly used in a case of detecting the voltage of the battery 98 and in a case of detecting the voltage of the battery 97.

Accordingly, according to the voltage detection device 1, the number of components that constitute the voltage detection device 1 can be reduced as much as the energizing route that is commonly used in a case of detecting the voltage of the batteries adjacent to each other.

In addition, specifically, the microcomputer 11 turns on the switches 48 and 57 and the switches 3 and 4, and turns off the switches 58, 47, 56, and 46 and the switches 5 and 6 to switch the connection state to the first connection state. In addition, the microcomputer 11 turns on the switches 58 and 47 and the switches 5 and 6, and turns off the switches 48, 57, 56, and 46 and the switches 3 and 4 to switch the connection state to the second connection state. In addition, the microcomputer 11 turns on the switches 47 and 56 and the switches 3 and 4, and turns off the switches 58, 48, 57, and 46 and the switches 5 and 6 to switch the connection state to the third connection state. In addition, the microcomputer 11 turns on the switches 57 and 46 and the switches 5 and 6, and turns of the switches 58, 48, 47, and 56 and the switches 3 and 4 to switch the connection state to the fourth connection state.

In the above-described embodiment, the battery 98 corresponds to a first battery in the present disclosure, the battery 97 corresponds to a second battery in the present disclosure, the energizing route P18 corresponds to a positive side diagnosis detection route in the present disclosure, the energizing route P8 corresponds to a positive side normal detection route in the present disclosure, the energizing route P17 corresponds to a negative side normal detection route in the present disclosure, the energizing route P7 corresponds to a negative side diagnosis detection route in the present disclosure, and the energizing route P16 corresponds to an adjacent normal detection route in the present disclosure.

In addition, the switches 3, 4, 5, 6, 58, 48, 57, 47, 56, and 46, and the microcomputer 11 correspond to a switching unit in the present disclosure.

In addition, the switch 58 corresponds to a switch on a positive side diagnosis route in the present disclosure, the switch 48 corresponds to a switch on a positive side normal route in the present disclosure, the switch 57 corresponds to a switch on a negative side normal route in the present disclosure, the switch 47 corresponds to a switch on a negative side diagnosis route in the present disclosure, and the switch 56 corresponds to a switch on an adjacent normal route in the present disclosure.

(Second Embodiment)

Hereinafter, a second embodiment of the present disclosure will be described with reference to the attached drawings. In addition, in the second embodiment, portions different from the first embodiment will be described.

Figure 3:
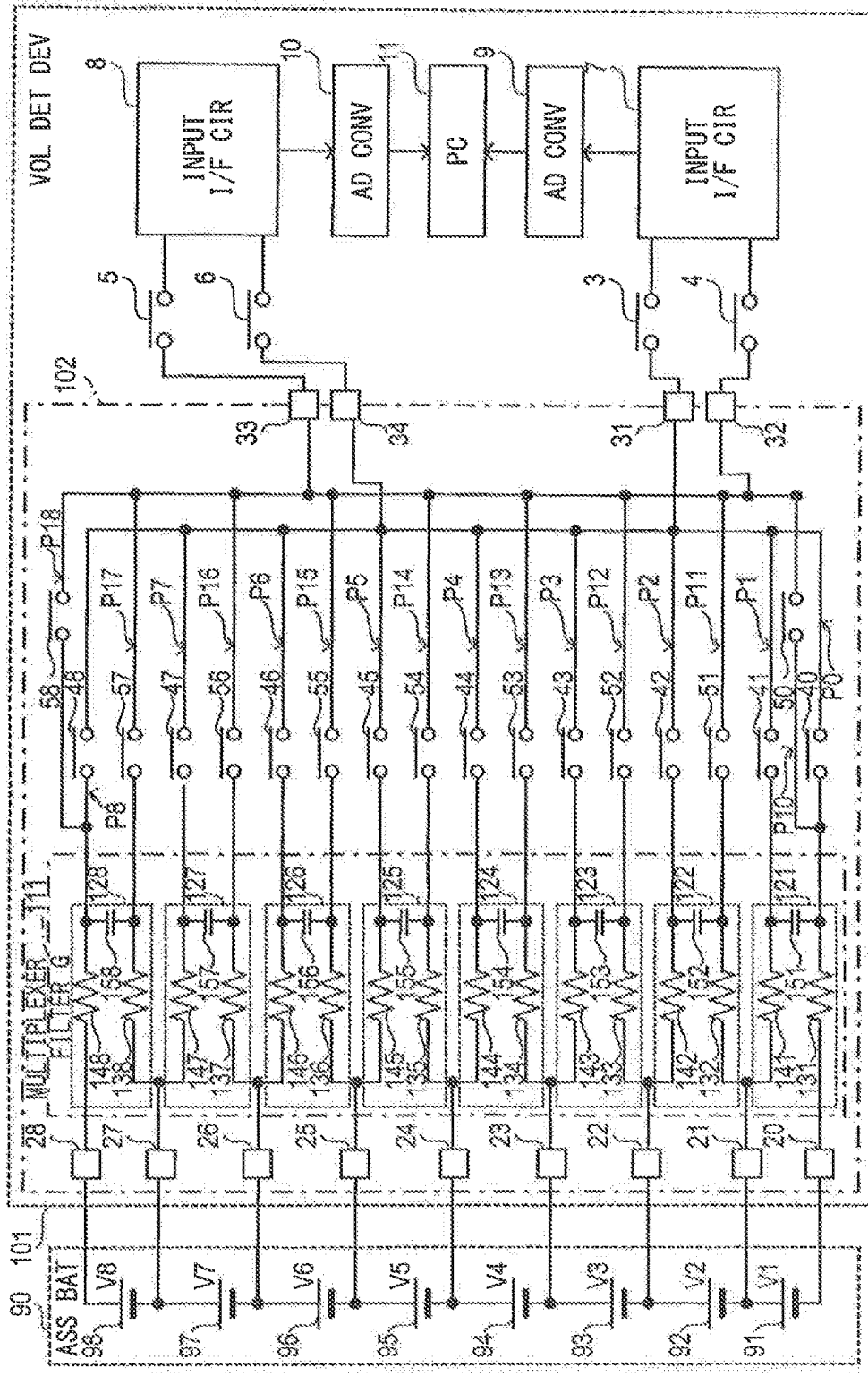
FIG. 3 is a circuit diagram illustrating a configuration of a voltage detection device.

As shown in FIG. 3, a voltage detection device 101 of this embodiment detects a voltage of an assembled battery 90.

The voltage detection device 101 includes a multiplexer 102, switches 3, 4, 5, and 6, input I/F circuits 7 and 8, AD converters 9 and 10, and a microcomputer 11.

The multiplexer 102 includes energizing routes P0, P1, P2, P3, P4, P5, P6, P7, and P8, energizing routes P10, P11, P12, P13, P14, P15, P16, P17, and P18, voltage input terminals 20, 21, 22, 23, 24, 25, 26, 27, and 28, voltage output terminals 31, 32, 33, and 34, switches 40, 41, 42, 43, 44, 45, 46, 47, and 48, switches 50, 51, 52, 53, 54, 55, 56, 57, and 58, and a filter group 111.

The filter group 111 includes filters 121, 122, 123, 124, 125, 126, 127, and 128.

The filter 121 includes a resistor 131, a resistor 141, and a capacitor 151. One end of the resistor 131 is connected to the voltage input terminal 20 and the other end is connected to the switches 40 and 50. One end of the resistor 141 is connected to the voltage input terminal 21 and the other end of the resistor 141 is connected to the switch 41. One end of the capacitor 151 is connected to the other end of the resistor 131 and the other end of the capacitor 151 is connected to the other end of the resistor 141.

Similarly, the filters 122, 123, 124, 125, 126, 127, and 128 include resistors 132, 133, 134, 135, 136, 137, and 138, resistors 142, 143, 144, 145, 146, 147, and 148, and capacitors 152, 153, 154, 155, 156, 157, and 158, respectively.

In addition, ends on one side of the resistors 132, 133, 134, 135, 136, 137, and 138 are connected to the voltage input terminals 21, 22, 23, 24, 25, 26, and 27, respectively, and ends on the other side of the resistors 132, 133, 134, 135, 136, 137, and 138 are connected to the switches 51, 52, 53, 54, 55, 56, and 57, respectively.

Ends on one side of the resistors 142, 143, 144, 145, 146, and 147 are connected to the voltage input terminals 22, 23, 24, 25, 26, and 27, respectively, and ends on the other side of the resistors 142, 143, 144, 145, 146, and 147 are connected to the switches 42, 43, 44, 45, 46, and 47, respectively. In addition, one end of the resistor 148 is connected to the voltage input terminal 28, and the other end of the resistor 148 is connected to the switches 48 and 58.

Ends on one side of the capacitors 152, 153, 154, 155, 156, 157, and 158 are connected to the ends on the other side of the resistors 132, 133, 134, 135, 136, 137, and 138, respectively, and ends on the other side of the capacitors 152, 153, 154, 155, 156, 157, and 158 are connected to the ends on the other side of the resistors 142, 143, 144, 145, 146, 147, and 148, respectively.

In addition, the microcomputer 11 controls operations of the switches 40 to 48, and 50 to 58 which constitute the multiplexer 102, and monitors the state of batteries 91 to 98 on the basis of digital signals output from the AD converters 9 and 10.

In addition, in the voltage detection device 101 configured as described above, a sequence of detecting the voltages of the batteries 91 to 98 is the same as that in the first embodiment (refer to FIG. 2).

The voltage detection device 101 configured as described above includes the energizing routes P18, P8, P17, P7, P16, and P6, the input I/F circuit 7, the input I/F circuit 8, the switches 58, 48, 57, 47, 56, and 46, the switches 3, 4, 5, and 6, and the microcomputer 11.

The energizing routes P18 and P8 are connected to the positive electrode of the battery 98 in the batteries 98 and 97 which are connected in series. The energizing routes P17 and P7 are connected to a connection point between the negative electrode of the battery 98 and the positive electrode of the battery 97. The energizing route P16 and P6 are connected to the negative electrode of the battery 97.

In addition, the input I/F circuit 7 includes the voltage input terminals 61 and 62, and detects a difference between a voltage input to the voltage input terminal 61 and a voltage input to the voltage input terminal 62. The input I/F circuit 8 includes the voltage input terminals 71 and 72, and detects a difference between a voltage input to the voltage input terminal 71 and a voltage input to the voltage input terminal 72.

As is the case with the first embodiment, the microcomputer 11 selects any one of the first connection state, the second connection state, the third connection state, and the fourth connection state by the switches 58, 48, 57, 47, 56, and 46, and the switches 3, 4, 5, and 6, and switches the connection state.

According to the voltage detection device 101 configured as described above, as is the case with the first embodiment, in a case where voltage detection results are different between the input I/F circuit 7 and the input I/F circuit 8, it can be determined that abnormality occurs in the voltage detection device 101. Furthermore, according to the voltage detection device 101, as is the case with the first embodiment, the number of components that constitute the voltage detection device 101 can be reduced as much as the energizing route that is commonly used in a case of detecting the voltage of the batteries adjacent to each other.

(Third Embodiment)

Hereinafter, a third embodiment of the present disclosure will be described with reference to the attached drawings.

Figure 4:
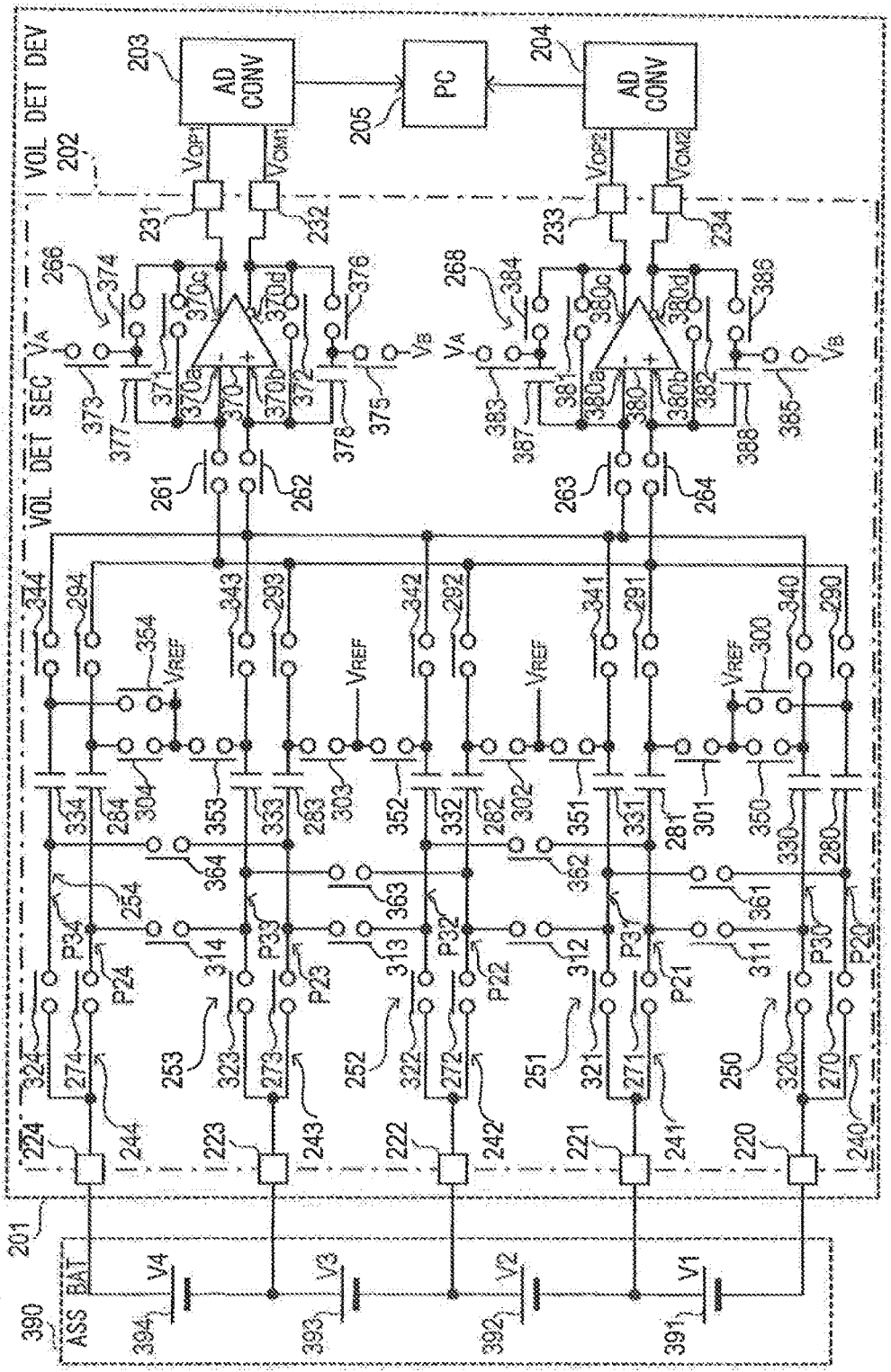
FIG. 4 is a circuit diagram illustrating a configuration of a voltage detection device of a third embodiment.

As shown in FIG. 4, a voltage detection device 201 of this embodiment detects a voltage of an assembled battery 390.

The assembled battery 390 is constituted by connecting a plurality of batteries in series, and includes batteries 391, 392, 393, and 394 in this embodiment. In addition, the batteries 391 to 394 are connected in series in such a manner that positive electrodes of the batteries 391, 392, and 393 are connected to negative electrodes of the batteries 392, 393, and 394, respectively. Hereinafter, voltages of the batteries 391, 392, 393, and 394 are respectively referred to as voltages V1, V2, V3, and V4. In addition, voltages of the positive electrodes of the batteries 391, 392, 393, and 394 are respectively referred to as voltages V$1_p$, V$2_p$, V$3_p$, and V$4_p$.

The voltage detection device 201 includes a voltage detection unit 202, AD converters 203 and 204, and a microcomputer 205.

The voltage detection unit 202 includes energizing routes P20, P21, P22, P23, and P24, energizing routes P30, P31, P32, P33, and P34, voltage input terminals 220, 221, 222, 223, and 224, voltage output terminals 231, 232, 233, and 234, switching circuits 240, 241, 242, 243, and 244, switching circuits 250, 251, 252, 253, and 254, switches 261, 262, 263, and 264, and voltage detection circuits 266 and 268.

The voltage input terminal 220 is connected to the negative electrode of the battery 391. In addition, the voltage input terminals 221, 222, 223, and 224 are connected to the positive electrodes of the batteries 391, 392, 393, and 394, respectively.

The energizing route P20 is formed to connect the voltage input terminal 220, and the switches 261 and 264 to each other. Similarly, the energizing routes P21, P22, P23, and P24 are formed to connect the voltage input terminals 221, 222, 223, and 224, and the switches 261 and 264 to each other.

The energizing route P30 is formed to connect the voltage input terminal 220 and the switches 262 and 263, respectively. Similarly, the energizing routes P31, P32, P33, and P34 are formed to connect the voltage input terminals 221, 222, 223, and 224, and the switches 262 and 263 to each other.

The switching circuits 240, 241, 242, 243, and 244 are provided to the energizing routes P20, P21, P22, P23, and P24, respectively.

The switching circuit 240 includes a switch 270, a capacitor 280, a switch 290, and a switch 300. In addition, one end of the switch 270 is connected to the voltage input terminal 220, and the other end of the switch 270 is connected to one end of the capacitor 280. In addition, one end of the switch 290 is connected to the other end of the capacitor 280, and the other end of the switch 290 is connected to the switches 261 and 264. In addition, one end of the switch 300 is connected to a reference voltage source (refer to a reference voltage $V_{REF}$), and the other end of the switch 300 is connected to a connection point between the capacitor 280 and the switch 290.

Similarly, the switching circuits 241, 242, 243, and 244 include switches 271, 272, 273, and 274, capacitors 281, 282, 283, and 284, switches 291, 292, 293, and 294, and switches 301, 302, 303, and 304, respectively. In addition, ends on one side of the switches 271, 272, 273, and 274 are connected to the voltage input terminals 221, 222, 223, and 224, respectively, and ends on the other side of the switches 271, 272, 273, and 274 are connected to ends on one side of the capacitors 281, 282, 283, and 284, respectively. In addition, ends on one side of the switches 291, 292, 293, and 294 are connected to ends on the other side of the capacitors 281, 282, 283, and 284, and ends on the other side of the switches 291, 292, 293, and 294 are connected to the switches 261 and 264, respectively. Furthermore, ends on one side of the switches 301, 302, 303, and 304 are connected to the reference voltage source (refer to the reference voltage $V_{REF}$), and ends on the other side of the switches 301, 302, 303, and 304 are connected to connection points between the capacitors 281, 282, 283, and 284, and the switches 291, 292, 293, and 294, respectively.

The switching circuits 250, 251, 252, 253, and 254 are provided to the energizing routes P30, P31, P32, P33, and P34, respectively.

The switching circuit 250 includes a switch 320, a capacitor 330, a switch 340, and a switch 350. In addition, one end of the switch 320 is connected to the voltage input terminal 220, and the other end of the switch 320 is connected to one end of the capacitor 330. In addition, one end of the switch 340 is connected to the other end of the capacitor 330, and the other end of the switch 340 is connected to the switches 262 and 263. In addition, one end of the switch 350 is connected to the reference voltage source (refer to the reference voltage $V_{REF}$), and the other end of the switch 350 is connected to a connection point between the capacitor 330 and the switch 340.

Similarly, the switching circuits 251, 252, 253, and 254 include switches 321, 322, 323, and 324, capacitors 331, 332, 333, and 334, switches 341, 342, 343, and 344, and switches 351, 352, 353, and 354, respectively. Ends on one side of the switches 321, 322, 323, and 324 are connected to the voltage input terminals 221, 222, 223, and 224, respectively, and ends on the other side of the switches 321, 322, 323, and 324 are connected to ends on one side of the capacitors 331, 332, 333, and 334, respectively. In addition, ends on one side of the switches 341, 342, 343, and 344 are connected to ends on the other side of the capacitors 331, 332, 333, and 334, respectively, and ends on the other side of the switches 341, 342, 343, and 344 are connected to the switches 262 and 263, respectively. Furthermore, ends on one side of the switches 351, 352, 353, and 354 are connected to the reference voltage source (refer to the reference voltage $V_{REF}$), and ends on the other side of the switches 351, 352, 353, and 354 are connected to connection points between the capacitors 331, 332, 333, and 334, and the switches 341, 342, 343, and 344, respectively.

Furthermore, the switching circuits 241, 242, 243, and 244 include switches 311, 312, 313, and 314, respectively. Ends on one side of the switches 311, 312, 313, and 314 are connected to connection points between the switches 271, 272, 273, and 274, and the capacitors 281, 282, 283, and 284, respectively, and ends on the other side of the switches 311, 312, 313, and 314 are connected to connection points between the switches 320, 321, 322, and 323, and the capacitors 330, 331, 332, and 333, respectively.

In addition, the switching circuits 251, 252, 253, and 254 include switches 361, 362, 363, and 364, respectively. Ends on one side of the switches 361, 362, 363, and 364 are connected to connection points between the switches 321, 322, 323, and 324, respectively, and the capacitors 331, 332, 333, and 334, and ends on the other side of the switches 361, 362, 363, and 364 are connected to connection points between the switches 270, 271, 272, and 273, and the capacitors 280, 281, 282, and 283, respectively.

Next, the voltage detection circuit 266 includes an operational amplifier 370, switches 371, 372, 372, 373, 374, 375, and 376, and capacitors 377 and 378.

The operational amplifier 370 includes an inverting input terminal 370a, a non-inverting input terminal 370b, a non-inverting output terminal 370c, and an inverting output terminal 370d. In addition, a common voltage $V_{COM}$ of the operational amplifier 370 is set to the reference voltage $V_{REF}$. In addition, the inverting input terminal 370a, the non-inverting input terminal 370b, the non-inverting output terminal 370c, and the inverting output terminal 370d of the operational amplifier 370 are connected to the switch 271, the switch 272, the voltage output terminal 231, and the voltage output terminal 232, respectively. Hereinafter, voltages that are output from the non-inverting output terminal 370c and the inverting output terminal 370d of the operational amplifier 370 are referred to as an output voltage $V_{OP1}$ and an output voltage $V_{OM1}$, respectively.

One end of the switch 371 is connected to the inverting input terminal 370a of the operational amplifier 370, and the other end of the switch 371 is connected to the non-inverting output terminal 370c of the operational amplifier 370. Similarly, one end of the switch 372 is connected to the non-inverting input terminal 370b of the operational amplifier 370, and the other end of the switch 372 is connected to the inverting output terminal 370d of the operational amplifier 370.

The switches 373 and 374 are provided to an energizing route that reaches the non-inverting output terminal 370c of the operational amplifier 370 from a constant voltage source (refer to a constant voltage $V_A$). In addition, one end of the switch 373 is connected to the constant voltage source (refer to the constant voltage $V_A$), and the other end of the switch 373 is connected to the switch 374. In addition, an end of the switch 374 on a side, which is not connected to the switch 373, is connected to the non-inverting output terminal 370c of the operational amplifier 370. Similarly, the switches 375 and 376 are provided to an energizing route that reaches the inverting output terminal 370d of the operational amplifier 370 from a constant voltage source (refer to a constant voltage $V_B$). In addition, one end of the switch 375 is connected to the constant voltage source (refer to the constant voltage $V_B$), and the other end of the switch 375 is connected to the switch 376. In addition, an end of the switch 376 on a side, which is not connected to the switch 375, is connected to the inverting output terminal 370d of the operational amplifier 370.

One end of the capacitor 377 is connected to the inverting input terminal 370a of the operational amplifier 370, and the other end of the capacitor 377 is connected to a connection point between the switch 373 and the switch 374. Similarly, one end of the capacitor 378 is connected to the non-inverting input terminal 370b of the operational amplifier 370, and the other end of the capacitor 378 is connected to a connection point between the switch 375 and the switch 376.

Next, the voltage detection circuit 268 includes an operational amplifier 380, switches 381, 382, 383, 384, 385, and 386, and capacitors 387 and 388.

The operational amplifier 380 includes an inverting input terminal 380a, a non-inverting input terminal 380b, a non-inverting output terminal 380c, and an inverting output terminal 380d. In addition, a common voltage $V_{COM}$ of the operational amplifier 380 is set to the reference voltage $V_{REF}$. In addition, the inverting input terminal 380a, the non-inverting input terminal 380b, the non-inverting output terminal 380c, and the inverting output terminal 380d of the operational amplifier 380 are connected to the switch 263, the switch 264, the voltage output terminal 233, and the voltage output terminal 234, respectively. Hereinafter, voltages that are output from the non-inverting output terminal 380c and the inverting output terminal 380d of the operational amplifier 380 are referred to as an output voltage $V_{OP2}$ and an output voltage $V_{OM2}$, respectively.

One end of the switch 381 is connected to the inverting input terminal 380a of the operational amplifier 380, and the other end of the switch 381 is connected to the non-inverting output terminal 380c of the operational amplifier 380. Similarly, one end of the switch 382 is connected to the non-inverting input terminal 380b of the operational amplifier 380, and the other end of the switch 382 is connected to the inverting output terminal 380d of the operational amplifier 380.

The switches 383 and 384 are provided to an energizing route that reaches the non-inverting output terminal 380c of the operational amplifier 380 from the constant voltage source (refer to the constant voltage $V_A$). In addition, one end of the switch 383 is connected to the constant voltage source (refer to the constant voltage $V_A$), and the other end of the switch 383 is connected to the switch 384. In addition, an end of the switch 384 on a side, which is not connected to the switch 383, is connected to the non-inverting output terminal 380c of the operational amplifier 380. Similarly, the switches 385 and 386 are provided to an energizing route that reaches the inverting output terminal 380d of the operational amplifier 380 from the constant voltage source (refer to a constant voltage $V_B$). In addition, one end of the switch 385 is connected to the constant voltage source (refer to the constant voltage $V_B$), and the other end of the switch 385 is connected to the switch 386. In addition, an end of the switch 386 on a side, which is not connected to the switch 385, is connected to the inverting output terminal 380d of the operational amplifier 380.

One end of the capacitor 387 is connected to the inverting input terminal 380a of the operational amplifier 380, and the other end of the capacitor 387 is connected to a connection point between the switch 383 and the switch 384. Similarly, one end of the capacitor 388 is connected to the non-inverting input terminal 380b of the operational amplifier 380, and the other end of the capacitor 388 is connected to a connection point between the switch 385 and the switch 386.

In addition, the AD converter 203 converts voltage values of analog signals output from the voltage output terminal 231 and the voltage output terminal 232 to digital signals, and outputs the digital signals to the microcomputer 205. The AD converter 204 converts voltage values of analog signals output from the voltage output terminal 233 and the voltage output terminal 234 to digital signals, and outputs the digital signals to the microcomputer 205.

The microcomputer 205 is constituted by a CPU, a ROM, a RAM, an I/O, a bus line that connects these components to each other, and the like, and controls operations of the switches that constitute the voltage detection unit 202, and monitors the state of the batteries 391 to 394 on the basis of the digital signals output from the AD converters 203 and 204.

Next, in the voltage detection device 201 configured as described above, a sequence of detecting voltages of the batteries 391 to 394 will be described.

Figure 5:
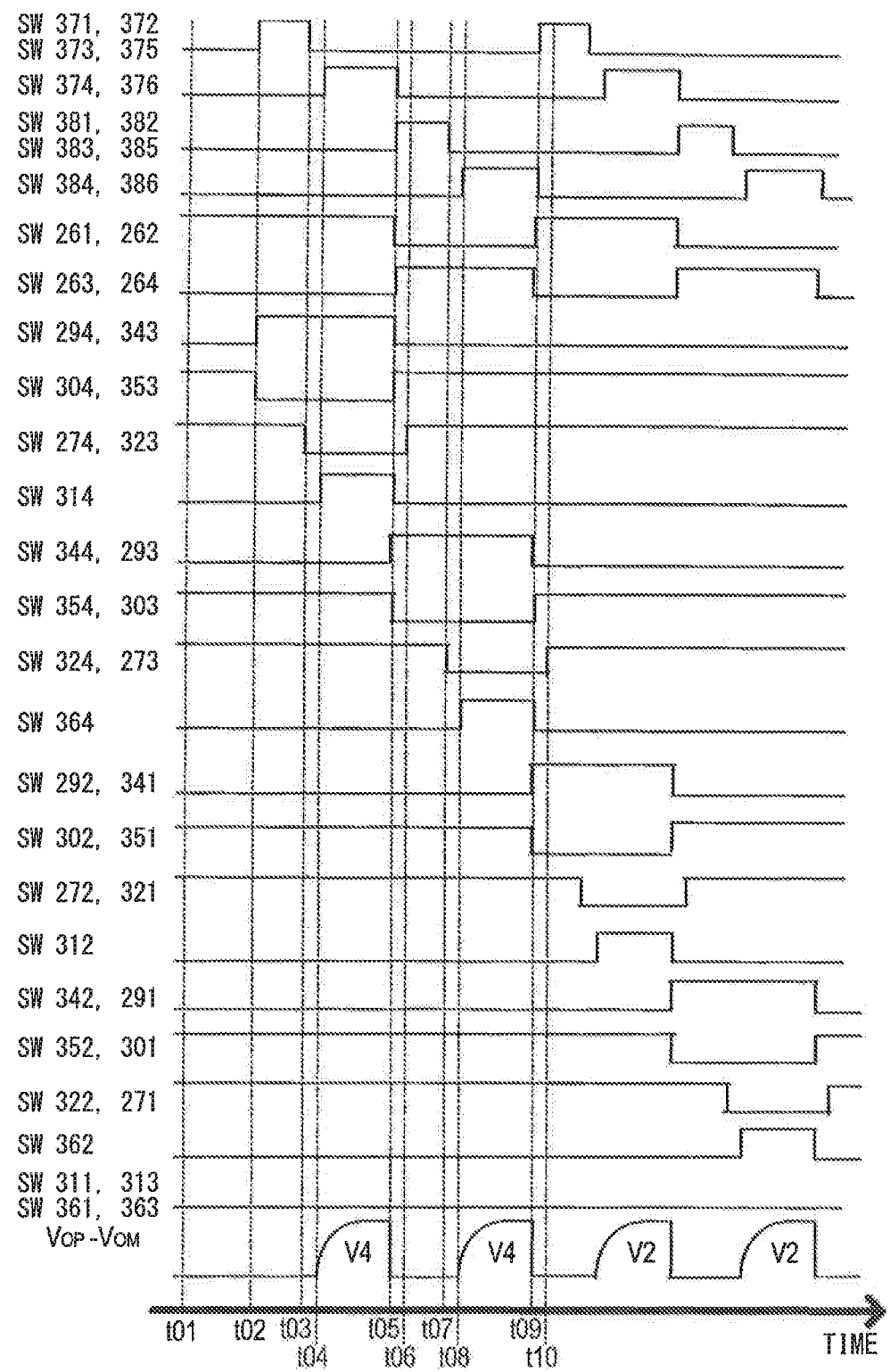
FIG. 5 is a timing chart illustrating a sequence of voltage detection carried out by the voltage detection device of the third embodiment.

As shown in FIG. 5, first, the microcomputer 205 turns on the switches 261 and 262, the switches 304 and 353, and the switches 274 and 323 (refer to time t01). According to this, the voltages $V4_p$ and $V3_p$ of the positive electrodes of the batteries 394 and 393 are applied to ends on one side of the capacitors 284 and 333, and the reference voltage $V_{REF}$ is applied to ends on the other side of the capacitors 284 and 333. That is, the capacitors 284 and 333 are charged with voltages of $(V4_p-V_{REF})$ and $(V3_p-V_{REF})$, respectively. In addition, at this point in time, the switches 270 to 273, the switches 320 to 322, and 324, the switches 301 to 303, and the switches 350 to 352, and 354 are also in an on-state. According to this, the capacitors 280 to 283, and the capacitors 330 to 332, and 334 are charged in advance.

Next, the switches 371, 372, 373, and 375, and the switches 294 and 343 are switched to an on-state, and the switches 304 and 353 are switched to an off-state (refer to time t02). When the switches 371 and 372 are turned on, the operational amplifier 370 enters a voltage follower state, and thus the output voltages $V_{OP1}$ and $V_{OM1}$ become the reference voltage $V_{REF}$ (=common voltage $V_{COM}$). According to this, the constant voltages $V_A$ and $V_B$ are applied to ends on one side of the capacitors 377 and 378, respectively, and the reference voltage $V_{REF}$ is applied to ends on the other side of the capacitors 377 and 378. That is, the capacitors 377 and 378 are charged with voltages of $(V_A-V_{REF})$ and $(V_B-V_{REF})$, respectively.

Next, the switches 371, 372, 373, and 375, and the switches 274 and 323 are switched to an off-state (refer to time t03).

Next, the switches 374 and 376, and the switch 314 are switched to an on-state (refer to time t04). According to this, charges that are accumulated in the capacitors 284 and 333 and the capacitors 377 and 378 are redistributed. Charges that are accumulated in the capacitor 284 and the capacitor 377, and amounts of charges that are accumulated in the capacitor 333 and the capacitor 378 are retained before and after the timing (that is, before and after the timing t04) at which the switches 374 and 376 and the switch 314 are switched to an on-state, and thus the following Expressions (1) and (2) are established. In addition, an input side voltage in the operational amplifier 370 is described as $V_X$, and a voltage at a connection point between the capacitor 284 and the capacitor 333 is described as $V_Y$. In addition, an electrostatic capacitance of the capacitors 284 and 333 is described as $C_1$, and an electrostatic capacitance of the capacitors 377 and 378 is described as $C_2$.

$$C_1(V4_p-V_{REF})+C_2(V_A-V_{REF})=C_1(V_Y-V_X)+C_2(V_{OP1}-V_X) \quad (1)$$

$$C_1(V3_p-V_{REF})+C_2(V_B-V_{REF})=C_1(V_Y-V_X)+C_2(V_{OM1}-V_X) \quad (2)$$

In addition, the following Expression (3) can be obtained from Expressions (1) and (2).

$$V_{OP1}-V_{OM1}=\{C_1(V4_p-V3_p)/C_2\}+(V_A-V_B) \quad (3)$$

That is, the voltage V4 of the battery 394 (a difference between the voltage $V4_p$ of the positive electrode of the battery 394 and the voltage $V3_p$ of the positive electrode of the battery 393) can be detected by detecting the output voltage $V_{OP1}$ and the output voltage $V_{OM1}$ of the operational amplifier 370.

Next, the switches 381, 382, 383, and 385, the switches 263 and 264, the switches 304 and 353, and the switches 344 and 293 are switched to an on-state, and the switches 374 and 376, the switches 261 and 262, the switch 314, and the switches 354 and 303 are switched to an off-state (refer to time t05). When the switches 381 and 382 enter an on-state, the operational amplifier 380 enters a voltage follower state, and thus the output voltages $V_{OP2}$ and $V_{OM2}$ become the reference voltage $V_{REF}$ (=common voltage $V_{COM}$). According to this, the constant voltages $V_A$ and $V_B$ are applied to ends on one side of the capacitors 387 and 388, respectively, and the reference voltage $V_{REF}$ is applied to ends on the other side of the capacitors 387 and 388. That is, the capacitors 387 and 388 are charged with voltages of $(V_A-V_{REF})$ and $(V_B-V_{REF})$, respectively. In addition, the capacitors 334 and 283 are charged in advance with voltages of $(V4_p-V_{REF})$ and $(V3_p-V_{REF})$, respectively.

Next, the switches 274 and 323 are switched to an on-state (refer to time t06). According to this, the capacitors 284 and 333 are charged with voltages of $(V4_p-V_{REF})$ and $(V3_p-V_{REF})$, respectively.

Next, the switches 381, 382, 383, and 385, and the switches 324 and 273 are switched to an off-state (refer to time t07).

Next, the switches 384 and 386, and the switch 364 are switched to an on-state (refer to time t08). According to this, charges that are accumulated in the capacitors 334 and 283, and the capacitors 387 and 388 are redistributed. Charges that are accumulated in the capacitor 334 and the capacitor 387, and amounts of charges that are accumulated in the capacitor 283 and the capacitor 388 are retained before and after the timing (that is, before and after the timing t08) at which the switches 384 and 386 and the switch 364 are switched to an on-state, and thus the following Expressions (4) and (5) are established. In addition, an input side voltage in the operational amplifier 380 is described as $V_X$, and a voltage at a connection point between the capacitor 334 and the capacitor 283 is described as $V_Y$. In addition, an electrostatic capacitance of the capacitors 334 and 283 is described as $C_1$, and an electrostatic capacitance of the capacitors 387 and 388 is described as $C_2$.

$$C_1(V4_p-V_{REF})+C_2(V_A-V_{REF})=C_1(V_Y-V_X)+C_2(V_{OP2}-V_X) \quad (4)$$

$$C_1(V3_p-V_{REF})+C_2(V_B-V_{REF})=C_1(V_Y-V_X)+C_2(V_{OM2}-V_X) \quad (5)$$

In addition, the following Expression (6) can be obtained from Expressions (4) and (5), $$V_{OP2}-V_{OM2}=\{C_1(V4_p-V3_p)/C_2\}+(V_A-V_B) \quad (6)$$

That is, the voltage V4 of the battery 394 (a difference between the voltage V4$_p$ of the positive electrode of the battery 394 and the voltage V3$_p$ of the positive electrode of the battery 393) can be detected by detecting the output voltage V$_{OP2}$ and the output voltage V$_{OM2}$ of the operational amplifier 380.

As described above, the voltage V4 of the battery 394 is detected by using the energizing routes P24 and P33, and the voltage detection circuit 266, and the voltage V4 of the battery 394 is detected by using the energizing routes P34 and P23, and the voltage detection circuit 268.

Next, the voltage V2 of the battery 392 is detected in the same sequence as the time t01 to the time t08. That is, the voltage V2 of the battery 392 is detected by using the energizing routes P22 and P31, and the voltage detection circuit 266, and the voltage V2 of the battery 392 is detected by using the energizing routes P32 and P21, and the voltage detection circuit 268.

In addition, when the detection of the voltage V2 of the battery 392 is completed, next, the voltage V3 of the battery 393 is detected in the same sequence as the time t01 to the time t08. That is, the voltage V3 of the battery 393 is detected by using the energizing routes P23 and P32, and the voltage detection circuit 266, and the voltage V3 of the battery 393 is detected by using the energizing routes P33 and P22, and the voltage detection circuit 268.

In addition, when the detection of the voltage V3 of the battery 93 is completed, next, the voltage V1 of the battery 391 is detected in the same sequence as the time t01 to the time t08. That is, the voltage V1 of the battery 391 is detected by using the energizing routes P21 and P30, and the voltage detection circuit 266, and the voltage V1 of the battery 391 is detected by using the energizing routes P31 and P20, and the voltage detection circuit 268.

The voltage detection device 201 configured as described above includes the energizing routes P34, P24, P33, P23, P32, and P22, the voltage detection circuit 266, the voltage detection circuit 268, the switches 344, 294, 343, 293, 342, and 292, the switches 261, 262, 263, and 264, and the microcomputer 205.

The energizing routes P34 and P24 are connected to the positive electrode of the battery 394 in the batteries 394 and 393 which are connected in series. The energizing routes P33 and P23 are connected to a connection point between the negative electrode of the battery 394 and the positive electrode of the battery 393. The energizing routes P32 and P22 are connected to the negative electrode of the battery 393.

In addition, the voltage detection circuit 266 includes the inverting input terminal 370a and the non-inverting input terminal 370b of the operational amplifier 370, and detects a voltage of a battery on the basis of a voltage input to the inverting input terminal 370a and a voltage input to the non-inverting input terminal 370b. The voltage detection circuit 268 includes the inverting input terminal 380a and the non-inverting input terminal 380b of the operational amplifier 380, and detects a voltage of a battery on the basis of a voltage input to the inverting input terminal 380a and a voltage input to the non-inverting input terminal 380b.

In addition, the microcomputer 205 selects any one of a first connection state, a second connection state, a third connection state, and a fourth connection state by the switches 344, 294, 343, 293, 342, and 292, and the switches 261, 262, 263, and 264, and switches the connection state. In addition, the first connection state represents a state in which the energizing route P24 and the energizing route P33 are connected to the inverting input terminal 370a and the non-inverting input terminal 370b, respectively. The second connection state represents a state in which the energizing route P34 and the energizing route P23 are connected to the inverting input terminal 380a and the non-inverting input terminal 380b, respectively. The third connection state represents a state in which the energizing route P23 and the energizing route P32 are connected to the inverting input terminal 370a and the non-inverting input terminal 370b. In addition, the fourth connection state represents a state in which the energizing route P33 and the energizing route P22 are connected to the inverting input terminal 380a and the non-inverting input terminal 380b, respectively.

In the voltage detection device 201 configured as described above, when the microcomputer 205 switches the connection state to the first connection state, the positive electrode of the battery 394 and the inverting input terminal 370a of the voltage detection circuit 266 are connected to each other through the energizing route P24, and the negative electrode of the battery 394 and the non-inverting input terminal 370b of the voltage detection circuit 266 are connected to each other through the energizing route P33. According to this, the voltage detection circuit 266 can detect the voltage of the battery 394.

In addition, when the microcomputer 205 switches the connection state to the second connection state, the positive electrode of the battery 394 and the inverting input terminal 380a of the voltage detection circuit 268 are connected to each other through the energizing route P34, and the negative electrode of the battery 394 and the non-inverting input terminal 380b of the voltage detection circuit 268 are connected to each other through the energizing route P23. According to this, the voltage detection circuit 268 can detect the voltage of the battery 394.

In addition, when the microcomputer 205 switches, the connection state to the third connection state, the positive electrode of the battery 393 and the inverting input terminal 370a of the voltage detection circuit 266 are connected to each other through the energizing route P23, and the negative electrode of the battery 393 and the non-inverting input terminal 370b of the voltage detection circuit 266 are connected to each other through the energizing route P32. According to this, the voltage detection circuit 266 can detect the voltage of the battery 393.

In addition, when the microcomputer 205 switches the connection state to the fourth connection state, the positive electrode of the battery 393 and the inverting input terminal 380a of the voltage detection circuit 268 are connected to each other through the energizing route P33, and the negative electrode of the battery 393 and the non-inverting input terminal 380b of the voltage detection circuit 268 are connected to each other through the energizing route P22. According to this, the voltage detection circuit 268 can detect the voltage of the battery 393.

As described above, the energizing routes, which are used in a case where the voltage detection circuit 266 detects the voltage of the battery 394, are the energizing routes P24 and P33, and the energizing routes, which are used in a case where the voltage detection circuit 268 detects the voltage of the battery 394, are the energizing routes P34 and P23. That is, the energizing routes, which are used in a case of detecting the voltage of the battery 394, are different between the voltage detection circuit 266 and the voltage detection circuit 268. Similarly, the energizing routes, which are used in a case of detecting the voltage of the battery 393, are different between the voltage detection circuit 266 and the voltage detection circuit 268. According to this, in a case where voltage detection results are different between the voltage detection circuit 266 and the voltage detection circuit 268, it can be determined that abnormality occurs in the voltage detection device 201.

Furthermore, the energizing route P33 is used in a case where the voltage detection circuit 266 detects the voltage of the battery 394, and in a case where the voltage detection circuit 268 detects the voltage of the battery 393. In addition, the energizing route P23 is used in a case where the voltage detection circuit 266 detects the voltage of the battery 393, and in a case where the voltage detection circuit 268 detects the voltage of the battery 394. That is, the energizing routes P33 and P23 are commonly used in a case of detecting the voltage of the battery 394 and in a case of detecting the voltage of the battery 393.

Accordingly, according to the voltage detection device 201, the number of components that constitute the voltage detection device 201 can be reduced as much as the energizing route that is commonly used in a case of detecting the voltage of the batteries adjacent to each other.

In addition, specifically, the microcomputer 205 turns on the switches 294 and 343 and the switches 261 and 262, and turns off the switches 344, 293, 342, and 292 and the switches 263 and 264 to switch the connection state to the first connection state. In addition, the microcomputer 205 turns on the switches 344 and 293 and the switches 263 and 264, and turns off the switches 294, 343, 342, and 292 and the switches 261 and 262 to switch the connection state to the second connection state. In addition, the microcomputer 205 turns on the switches 293 and 342 and the switches 261 and 262, and turns off the switches 344, 294, 343, and 292 and the switches 263 and 264 to switch the connection state to the third connection state. In addition, the microcomputer 205 turns on the switches 343 and 292 and the switches 263 and 264, and turns off the switches 344, 294, 293, and 342 and the switches 261 and 262 to switch the connection state to the fourth connection state.

In addition, the capacitor 334 is provided between the positive electrode of the battery 394 and the switch 344 on the energizing route P34. The capacitor 284 is provided between the positive electrode of the battery 394 and the switch 294 on the energizing route P24. The capacitor 333 is provided between a connection point between the negative electrode of the battery 394 and the positive electrode of the battery 393, and the switch 343 on the energizing route P33. The capacitor 283 is provided between a connection point between the negative electrode of the battery 394 and the positive electrode of the battery 393, and the switch 293 on the energizing route P23. The capacitor 332 is provided between the negative electrode of the battery 393 and the switch 342 on the energizing route P32. The capacitor 282 is provided between the negative electrode of the battery 393 and the switch 292 on the energizing route P22.

In addition, the switch 324 is provided between the positive electrode of the battery 394 and the capacitor 334 on the energizing route P34. The switch 274 is provided between the positive electrode of the battery 394 and the capacitor 284 on the energizing route P24. The switch 323 is provided between a connection point between the negative electrode of the battery 394 and the positive electrode of the battery 393, and the capacitor 333 on the energizing route P33. The switch 273 is provided between a connection point of the negative electrode of the battery 394 and the positive electrode of the battery 393 and the capacitor 283 on the energizing route P23. The switch 322 is provided between the negative electrode of the battery 393 and the capacitor 332 on the energizing route P32. The switch 272 is provided between the negative electrode of the battery 393 and the capacitor 282 on the energizing route P22.

In addition, one end of the switch 314 is connected to a connection point between the capacitor 284 and the switch 274, and the other end of the switch 314 is connected to a connection point between the capacitor 333 and the switch 323. One end of the switch 364 is connected to a connection point between the capacitor 334 and the switch 324, and the other end of the switch 364 is connected to a connection point between the capacitor 283 and the switch 273. One end of the switch 313 is connected to a connection point between the capacitor 283 and the switch 273, and the other end of the switch 313 is connected to a connection point between the capacitor 332 and the switch 322. One end of the switch 363 is connected to a connection point between the capacitor 333 and the switch 323, and the other end of the switch 363 is connected to a connection point between the capacitor 282 and the switch 272.

In addition, one end of the switch 354 is connected to a connection point between the capacitor 334 and the switch 344, and the reference voltage $V_{REF}$ is applied to the other end of the switch 354. One end of the switch 304 is connected to a connection point between the capacitor 284 and the switch 294, and the reference voltage $V_{REF}$ is applied to the other end of the switch 304. One end of the switch 353 is connected to a connection point between the capacitor 333 and the switch 343, and the reference voltage $V_{REF}$ is applied to the other end of the switch 353. One end of the switch 303 is connected to a connection point between the capacitor 283 and the switch 293, and the reference voltage $V_{REF}$ is applied to the other end of the switch 303. One end of the switch 352 is connected to a connection point between the capacitor 332 and the switch 342, and the reference voltage $V_{REF}$ is applied to the other end of the switch 352. One end of the switch 302 is connected to a connection point between the capacitor 282 and the switch 292, and the reference voltage $V_{REF}$ is applied to the other end of the switch 302.

In addition, the voltage detection circuit 266 includes the operational amplifier 370, the switches 371 and 372, and the capacitors 377 and 378. In the operational amplifier 370, a common voltage is set to the reference voltage $V_{REF}$, and the operational amplifier 370 includes the inverting input terminal 370$a$, the non-inverting input terminal 370$b$, the non-inverting output terminal 370$c$, and the inverting output terminal 370$d$. The switch 371 and the capacitor 377 are connected in parallel between the inverting input terminal 370$a$ and the non-inverting output terminal 370$c$. The switch 372 and the capacitor 378 are connected in parallel between the non-inverting input terminal 370$b$ and the inverting output terminal 370$d$.

In addition, the voltage detection circuit 268 includes the operational amplifier 380, the switches 381 and 382, and the capacitors 387 and 388. In the operational amplifier 380, a common voltage is set to the reference voltage $V_{REF}$, and the operational amplifier 380 includes the inverting input terminal 380$a$, the non-inverting input terminal 380$b$, the non-inverting output terminal 380$c$, and the inverting output terminal 380$d$. The switch 381 and the capacitor 387 are connected in parallel between the inverting input terminal 380$a$ and the non-inverting output terminal 380$c$. The switch 382 and the capacitor 388 are connected in parallel between the non-inverting input terminal 380$b$ and the inverting output terminal 380$d$.

In the voltage detection device 201 configured as described above, the voltage detection circuit 266 can detect the voltage of the batten 394 in the following sequence.

First, when the switches 261 and 262 are in an on-state, the switches 274 and 323, and the switches 304 and 353 are turned on. According to this, the voltages $V4_p$ and $V3_p$ of the positive electrodes of the batteries 394 and 393 are applied to ends on one side of the capacitors 284 and 333, and the reference voltage $V_{REF}$ is applied to ends on the other side of the capacitors 284 and 333. That is, the capacitors 284 and 333 are charged with voltages of $(V4_p-V_{REF})$ and $(V3_p-V_{REF})$, respectively.

Next, the switches 371 and 372, and the switches 294 and 343 are switched to an on-state and the switches 304 and 353 are switched to an off-state. When the switches 371 and 372 are turned on, the operational amplifier 370 enters a voltage follower state, and thus the output voltages $V_{OP1}$ and $V_{OM1}$ become the reference voltage $V_{REF}$ (=common voltage $V_{COM}$). According to this, the capacitors 377 and 378 are charged with a voltage difference corresponding to a voltage applied to ends on one side of the capacitors 377 and 378 and a voltage applied to ends on the other side of the capacitors 377 and 378. In this embodiment, the constant voltages $V_A$ and $V_B$ are applied to the ends on one side of the capacitors 377 and 378, respectively, by switching the switches 373 and 375 to an on-state when the switches 374 and 376 are in an off-state. In addition, the reference voltage $V_{REF}$ is applied to the ends on the other side of the capacitors 377 and 378. That is, the capacitors 377 and 378 are charged with voltages of $(V_A-V_{REF})$ and $(V_B-V_{REF})$, respectively.

Next, the switches 371, 372, 373, and 375, and the switches 274 and 323 are switched to an off-state.

Next, the switches 374 and 376, and the switch 314 are switched to an on-state. According to this, charges that are accumulated in the capacitors 284 and 333 and the capacitors 377 and 378 are redistributed. According to the redistribution, the voltage $V_{OP1}$ that is output from the non-inverting output terminal 370c of the operational amplifier 370, and the voltage $V_{OM1}$ that is output from the inverting output terminal 370d vary to satisfy Expression (3). That is, the voltage V4 of the battery 394 can be detected by detecting the output voltage $V_{OP1}$ and the output voltage $V_{OM1}$ of the operational amplifier 370.

In addition, the voltage detection circuit 268 can detect the voltage of the battery 394 by performing switching of switches by using the switches 324 and 344 and the capacitor 334 which are provided on the energizing route P34, the switches 273 and 293 and the capacitor 283 which are provided on the energizing route P23, and the switches 354, 303, and 364 in the same sequence as the detection of the voltage of the battery 394 by the voltage detection circuit 266.

In addition, the voltage detection circuit 266 can detect the voltage of the battery 393 by performing switching of switches by using the switches 273 and 293 and the capacitor 283 which are provided on the energizing route P23, the switches 322 and 342 and the capacitor 332 which are provided on the energizing route P32, and the switches 303, 352, and 313 in the same sequence as the detection of the voltage of the battery 394 by the voltage detection circuit 266.

In addition, the voltage detection circuit 268 can detect the voltage of the battery 393 by performing switching of switches by using the switches 323 and 343 and the capacitor 333 which are provided on the energizing route P33, the switches 272 and 292 and the capacitor 282 which are provided on the energizing route P22, and the switches 353, 302, and 363 in the same sequence as the detection of the voltage of the battery 394 by the voltage detection circuit 266.

In the above-described embodiment, the energizing route P34 corresponds to the positive side diagnosis detection route in the present disclosure, the energizing route P24 corresponds to the positive side normal detection route in the present disclosure, the energizing route P33 corresponds to the negative side normal detection route in the present disclosure, the energizing route P23 corresponds to the negative side diagnosis detection route in the present disclosure, and the energizing route P32 corresponds to the adjacent normal detection route in the present disclosure.

In addition, the switches 261, 262, 263, 264, 344, 294, 343, 293, 342, and 292, and the microcomputer 205 correspond to the switching unit in the present disclosure.

In addition, the switch 344 corresponds to the switch on the positive side diagnosis route in the present disclosure, the switch 294 corresponds to a switch on the positive side normal route in the present disclosure, the switch 343 corresponds to the switch on the negative side normal route in the present disclosure, the switch 293 corresponds to the switch on the negative side diagnosis route in the present disclosure, and the switch 342 corresponds to the switch on the adjacent normal route in the present disclosure.

In addition, the capacitor 334 corresponds to a capacitor on the positive side diagnosis route in the present disclosure, the capacitor 284 corresponds to a capacitor on the positive side normal route in the present disclosure, the capacitor 333 corresponds to a capacitor on the negative side normal route in the present disclosure, and the capacitor 283 corresponds to a capacitor on the negative side diagnosis route in the present disclosure.

In addition, the switch 324 corresponds to a switch on a first battery side in the present disclosure, the switch 274 corresponds to a switch on a second battery side in the present disclosure, the switch 323 corresponds to a switch on a third battery side in the present disclosure, and the switch 273 corresponds to a switch on a fourth battery side in the present disclosure.

In addition, the switch 314 corresponds to a first inter-route switch in the present disclosure, and the switch 364 corresponds to a second inter-route switch in the present disclosure.

In addition, the switch 354 corresponds to a first reference voltage switch in the present disclosure, the switch 304 corresponds to a second reference voltage switch in the present disclosure, the switch 353 corresponds to a third reference voltage switch in the present disclosure, and the switch 303 corresponds to a fourth reference voltage switch in the present disclosure.

In addition, the inverting input terminal 370a corresponds to a first inverting input terminal in the present disclosure, the non-inverting input terminal 370b corresponds to a first non-inverting input terminal in the present disclosure, the non-inverting output terminal 370c corresponds to a first non-inverting output terminal in the present disclosure, the inverting output terminal 370d corresponds to a first inverting output terminal in the present disclosure, the operational amplifier 370 corresponds to a first operational amplifier in the present disclosure, the switch 371 corresponds to a first inverting input side switch in the present disclosure, the capacitor 377 corresponds to a first inverting input side capacitor in the present disclosure, the switch 372 corresponds to a first non-inverting input side switch in the present disclosure, and the capacitor 378 corresponds to a first non-inverting input side capacitor in the present disclosure.

(Fourth Embodiment)

Hereinafter, a fourth embodiment of the present disclosure will be described with reference to the attached drawings. In addition, in the fourth embodiment, portions different from the third embodiment will be described.

Figure 6:
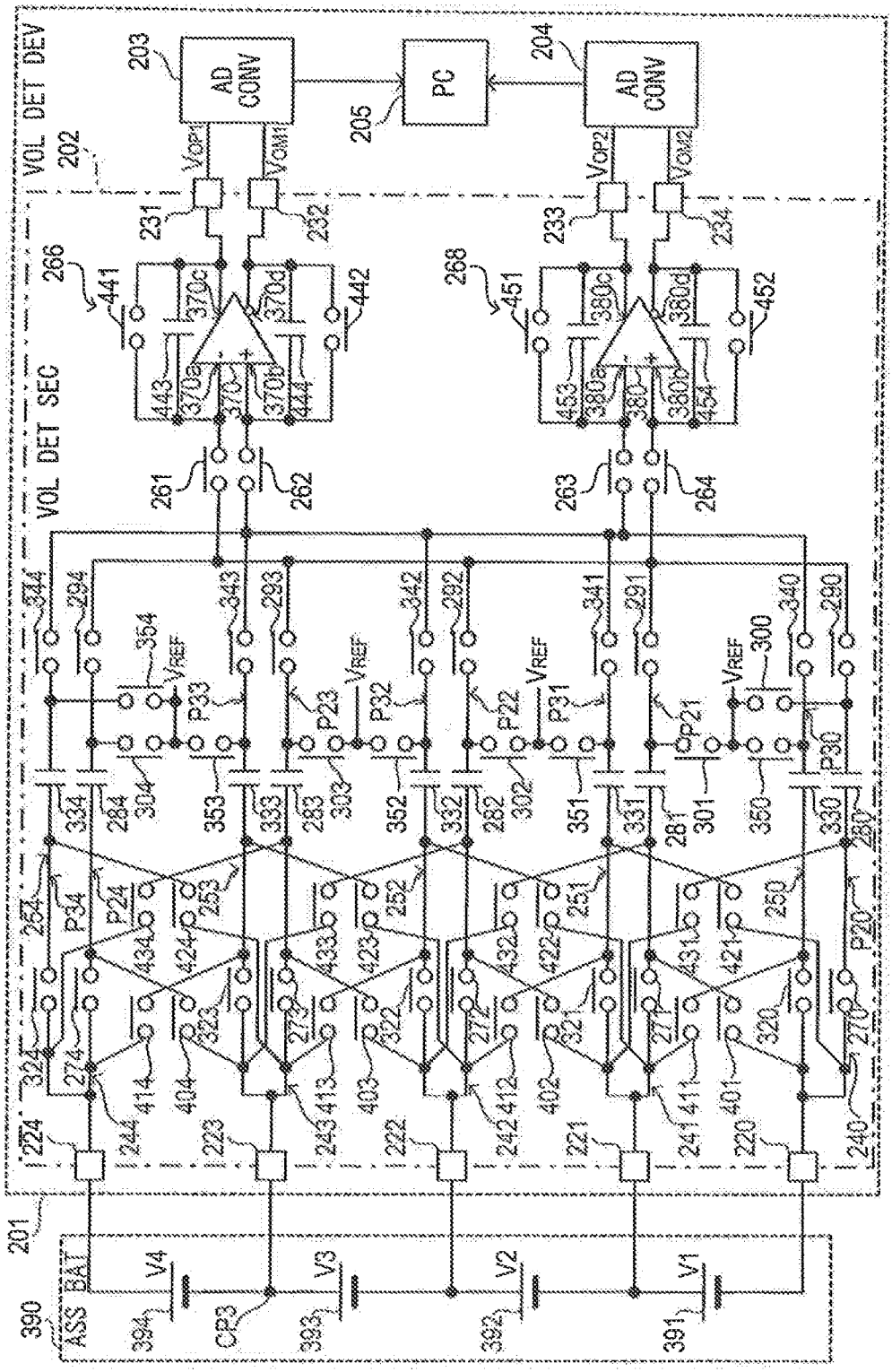
FIG. 6 is a circuit diagram illustrating a configuration of a voltage detection device of a fourth embodiment.

As shown in FIG. 6, a voltage detection device 201 of the fourth embodiment is the same as that of the third embodiment except that configurations of the switching circuits 241 to 244, and 251 to 254, and configurations of the voltage detection circuits 266 and 268 are changed.

First, the fourth embodiment is the same as the third embodiment except that the switching circuits 241, 242, 243, and 244, and the switches 311, 312, 313, and 314 are omitted, and switches 401, 402, 403, and 404 are added, and switches 411, 412, 413, and 414 are added.

In addition, ends on one side of the switches 401, 402, 403, and 404 are connected to connection points between voltage input terminals 220, 221, 222, and 223, and switches 320, 321, 322, and 323, respectively, and ends on the other side of the switches 401, 402, 403, and 404 are connected to connection points between switches 271, 272, 273, and 274, and capacitors 281, 282, 283, and 284, respectively.

In addition, ends on one side of the switches 411, 412, 413, and 414 are connected to connection points between the voltage input terminals 221, 222, 223, and 224, and the switches 271, 272, 273, and 274, respectively, and ends on the other side of the switches 411, 412, 413, and 414 are connected to connection points between the switches 320, 321, 322, and 323, and capacitors 330, 331, 332, and 333, respectively.

Switching circuits 251, 252, 253, and 254 are the same as the third embodiment except that the switches 361, 362, 363, and 364 are omitted, switches 421, 422, 423, and 424 are added, and switches 431, 432, 433, and 434 are added.

In addition, ends on one side of the switches 421, 422, 423, and 424 are connected to connection points between the voltage input terminals 220, 221, 222, and 223, and the switches 270, 271, 272, and 273, respectively, and ends on the other side of the switches 421, 422, 423, and 424 are connected to connection points between the switches 321, 322, 323, and 324, and the capacitors 331, 332, 333, and 334, respectively.

In addition, ends on one side of the switches 431, 432, 433, and 434 are connected to connection points between the voltage input terminals 221, 222, 223, and 224, and the switches 321, 322, 323, and 324, respectively, and ends on the other side of the switches 431, 432, 433, and 434 are connected to connection points between the switches 270, 271, 272, and 273, and the capacitors 280, 281, 282, and 283.

Next, the voltage detection circuit 266 of the fourth embodiment includes the above-described operational amplifier 370, switches 441 and 442, and capacitors 443 and 444.

In addition, the switch 441 is provided on an energizing route that reaches the non-inverting output terminal 370c from the inverting input terminal 370a of the operational amplifier 370. In addition, the switch 442 is provided on an energizing route that reaches the inverting output terminal 370d from the non-inverting input terminal 370b of the operational amplifier 370. In addition, one end of the capacitor 443 is connected to the inverting input terminal 370a of the operational amplifier 370, and the other end of the capacitor 443 is connected to the non-inverting output terminal 370c of the operational amplifier 370. In addition, one end of the capacitor 444 is connected to the non-inverting input terminal 370b of the operational amplifier 370, and the other end of the capacitor 444 is connected to the inverting output terminal 370d of the operational amplifier 370.

Similarly, the voltage detection circuit 268 of the fourth embodiment includes the above-described operational amplifier 380, switches 451 and 452, and capacitors 453 and 454.

In addition, the switch 451 is provided on an energizing route that reaches the non-inverting output terminal 380c from the inverting input terminal 380a of the operational amplifier 380. In addition, the switch 452 is provided on an energizing route that reaches the inverting output terminal 380d from the non-inverting input terminal 380b of the operational amplifier 380. In addition, one end of the capacitor 453 is connected to the inverting input terminal 380a of the operational amplifier 380, and the other end of the capacitor 453 is connected to the non-inverting output terminal 380c of the operational amplifier 380. In addition, one end of the capacitor 454 is connected to the non-inverting input terminal 380b of the operational amplifier 380, and the other end of the capacitor 454 is connected to the inverting output terminal 380d of the operational amplifier 380.

Next, in the voltage detection device 201 configured as described above, a sequence of detecting voltages of the batteries 391 to 394 will be described.

Figure 7:
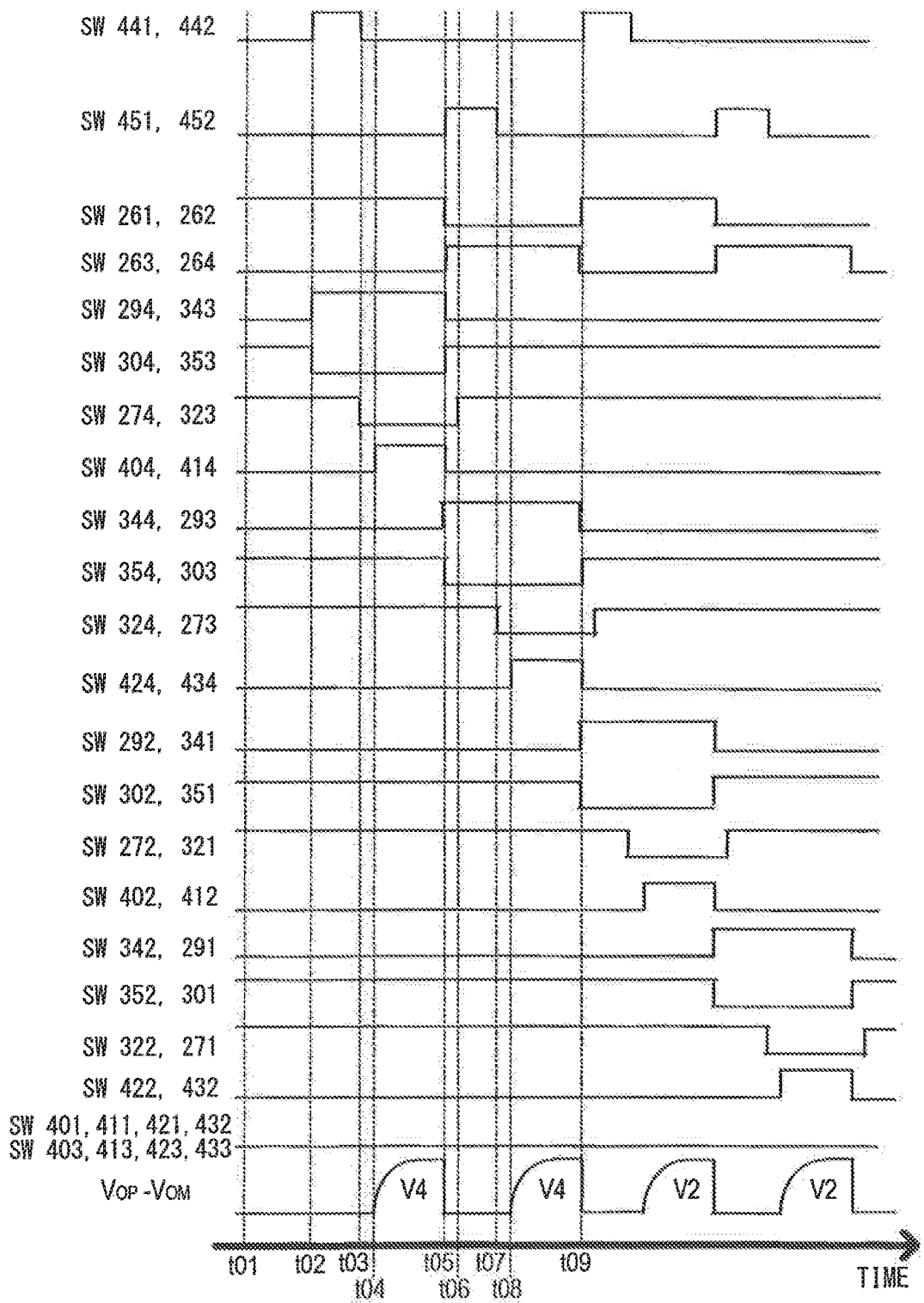
FIG. 7 is a timing chart illustrating a sequence of voltage detection carried out by the voltage detection device of the fourth embodiment.

As shown in FIG. 7, first, the microcomputer 205 turns on switches 261 and 262, switches 304 and 353, and the switches 274 and 323 (refer to time t01). According to this, the voltages $V4_p$ and $V3_p$ of the positive electrodes of the batteries 394 and 393 are applied to ends on one side of the capacitors 284 and 333, and the reference voltage $V_{REF}$ is applied to ends on the other side of the capacitors 284 and 333. That is, the capacitors 284 and 333 are charged with voltages of $(V4_p-V_{REF})$ and $(V3_p-V_{REF})$, respectively. In addition, at this point in time, the switches 270 to 273, the switches 320 to 322, and 324, the switches 301 to 303, and the switches 350 to 352, and 354 are also in an on-state. According to this, the capacitors 280 to 283, and the capacitors 330 to 332, and 334 are charged in advance.

Next, the switches 441 and 442, and switches 294 and 343 are switched to an on-state, and the switches 304 and 353 are switched to an off-state (refer to time t02). When the switches 441 and 442 are turned on, the operational amplifier 370 enters a voltage follower state, and thus output voltages $V_{OP1}$ and $V_{OM1}$ become the reference voltage $V_{REF}$ (=common voltage $V_{COM}$). According to this, the capacitors 284 and 333 are charged with voltages of $(V4_p-V_{REF})$ and $(V3_p-V_{REF})$, respectively.

Next, the switches 441 and 442, and the switches 274 and 323 are switched to an off-state (refer to time t03).

Next, the switches 404 and 414 are switched to an on-state (refer to time t04). According to this, the voltages $V3_p$ and $V4_p$ of the positive electrodes of the batteries 393 and 394 are applied to ends on one side of the capacitors 284 and 333, and the reference voltage $V_{REF}$ is applied to ends on the other side of the capacitors 284 and 333. At this time, charges that are accumulated in the capacitors 284 and 333 are redistributed between the capacitors 443 and 444. Amounts of charges that are accumulated in the capacitors 284 and 333 are retained before and after the timing (that is, before and after the timing t04) at which the switches 404 and 414 are switched to an on-state, and thus the following Expressions (7) and (8) are established. In addition, an electrostatic capacitance of the capacitors 284 and 333 is described as $C_1$, and an electrostatic capacitance of the capacitors 443 and 444 is described as $C_2$.

$$C_1(V4_p-V_{REF})=C_1(V3_p-V_{REF})+C_2(V_{OP1}-V_{REF}) \quad (7)$$

$$C_1(V3_p-V_{REF})=C_1(V4_p-V_{REF})+C_2(V_{OM1}-V_{REF}) \quad (8)$$

In addition, the following Expression (9) can be obtained from Expressions (7) and (8).

$$V_{OP1}-V_{OM1}=\{2C_1(V4_p-V3_p)/C_2\} \quad (9)$$

That is, the voltage V4 of the battery 394 (a difference between the voltage $V4_p$ of the positive electrode of the battery 394 and the voltage $V3_p$ of the positive electrode of the battery 393) can be detected by detecting the output voltage $V_{OP1}$ and the output voltage $V_{OM1}$ of the operational amplifier 370.

Next, the switches 451 and 452, switches 263 and 264, the switches 304 and 353, and switches 344 and 293 are switched to an on-state, and the switches 261 and 262, the switches 404 and 414, and the switches 354 and 303 are switched to an off-state (refer to time t05). When the switches 451 and 452 enter an on-state, the operational amplifier 380 enters a voltage follower state, and thus the output voltages $V_{OP2}$ and $V_{OM2}$ become the reference voltage $V_{REF}$ common voltage $V_{COM}$). According to this, the capacitors 334 and 283 are charged with voltages of ($V4_p-V_{REF}$) and ($V3_p-V_{REF}$), respectively.

Next, the switches 274 and 323 are switched to an on-state (refer to time t06). According to this, the capacitors 284 and 333 are charged with voltages of ($V4_p-V_{REF}$) and ($V3_p-V_{REF}$), respectively.

Next, the switches 451 and 452, and the switches 324 and 273 are switched to an off-state (refer to time t07).

Next, the switches 424 and 434 are switched to an on-state (refer to time t08). According to this, the voltages $V3_p$ and $V4_p$ of the positive electrodes of the batteries 393 and 394 are applied to ends on one side of the capacitors 334 and 283, and the reference voltage $V_{REF}$ is applied to ends on the other side of the capacitors 334 and 283. At this time, charges accumulated in the capacitors 334 and 283 are redistributed between the capacitors 453 and 454. Amounts of charges that are accumulated in the capacitors 334 and 283 are retained before and after the timing (that is, before and after the timing t08) at which the switches 424 and 434 are switched to an on-state, and thus the following Expressions (10) and (11) are established. In addition, an electrostatic capacitance of the capacitors 334 and 283 is described as $C_1$, and an electrostatic capacitance of the capacitors 453 and 454 is described as $C_2$.

$$C_1(V4_p-V_{REF})=C_1(V3_p-V_{REF})+C_2(V_{OP2}-V_{REF}) \quad (10)$$

$$C_1(V3_p-V_{REF})=C_1(V4_p-V_{REF})+C_2(V_{OM2}-V_{REF}) \quad (11)$$

In addition, the following Expression (12) can be obtained from Expressions (10) and (11).

$$V_{OP2}-V_{OM2}=\{2C_1(V4_p-V3_p)/C_2\} \quad (12)$$

That is, the voltage V4 of the bate 394 (a difference between the voltage $V4_p$ of the positive electrode of the batten 394 and the voltage $V3_p$ of the positive electrode of the battery 393) can be detected by detecting the output voltage $V_{OP2}$ and the output voltage $V_{OM2}$ of the operational amplifier 380.

As described above, the voltage V4 of the battery 394 is detected by using the energizing routes P24 and P33, and the voltage detection circuit 266, and the voltage V4 of the battery 394 is detected by using the energizing routes P34 and P23, and the voltage detection circuit 268.

Next, the voltage V2 of the battery 392 is detected in the same sequence as the time t01 to the time t08. That is, the voltage V2 of the battery 392 is detected by using the energizing routes P22 and P31, and the voltage detection circuit 266, and the voltage V2 of the battery 392 is detected by using the energizing routes P32 and P21, and the voltage detection circuit 268.

In addition, when the detection of the voltage V2 of the battery 92 is completed, next, the voltage V3 of the battery 393 is detected in the same sequence as the time t01 to the time t08. That is, the voltage V3 of the battery 393 is detected by using the energizing routes P23 and P32, and the voltage detection circuit 266, and the voltage V3 of the battery 393 is detected by using the energizing routes P33 and P22, and the voltage detection circuit 268.

In addition, when the detection of the voltage V3 of the battery 9 is completed, next, the voltage V1 of the battery 391 is detected in the same sequence as the time t01 to the time t08. That is, the voltage V1 of the battery 391 is detected by using the energizing routes P21 and P30, and the voltage detection circuit 266, and the voltage V1 of the battery 391 is detected by using the energizing routes P31 and P20, and the voltage detection circuit 268.

The voltage detection device 201 configured as described above includes the switches 404, 414, 424, 434, 403, 413, 423, and 433.

One end of the switch 404 is connected to a connection point between the capacitor 284 and the switch 274, and the other end of the switch 404 is connected to a connection point between a connection point (hereinafter, referred to as an electrode connection point CP3 (refer to FIG. 6)) of the negative electrode of the battery 394 and the positive electrode of the battery 393, and the switch 323.

One end of the switch 414 is connected to a connection point between the capacitor 333 and the switch 323, and the other end of the switch 414 is connected to a connection point between the positive electrode of the battery 394 and the switch 274.

One end of the switch 424 is connected to a connection point between the capacitor 334 and the switch 324, and the other end of the switch 424 is connected to a connection point between the electrode connection point CP3 and the switch 273.

One end of the switch 434 is connected to a connection point between the capacitor 283 and the switch 273, and the other end of the switch 434 is connected to a connection point between the positive electrode of the battery 394 and the switch 324.

One end of the switch 403 is connected to a connection point between the capacitor 283 and the switch 273, and the other end of the switch 403 is connected to a connection point between the negative electrode of the battery 393 and the switch 322.

One end of the switch 413 is connected to a connection point of the capacitor 332 and the switch 322, and the other end of the switch 413 is connected to a connection point between the electrode connection point CP3 and the switch 273.

One end of the switch 423 is connected to a connection point between the capacitor 333 and the switch 323, and the other end of the switch 423 is connected to a connection point between the negative electrode of the battery 393 and the switch 272.

One end of the switch 433 is connected to a connection point between the capacitor 282 and the switch 272, and the other end of the switch 433 is connected to a connection point between the electrode connection point CP3 and the switch 323.

In addition, the voltage detection circuit 266 includes the operational amplifier 370, the switches 441 and 442, and the capacitors 443 and 444. In the operational amplifier 370, a common voltage is set to the reference voltage $V_{REF}$, and the operational amplifier 370 includes the inverting input terminal 370*a*, the non-inverting input terminal 370*b*, the non-inverting output terminal 370*c*, and the inverting output terminal 370*d*. The switch 441 and the capacitor 443 are connected in parallel between the inverting input terminal 370*a* and the non-inverting output terminal 370*c*. The switch 442 and the capacitor 444 are connected in parallel between the non-inverting input terminal 370*b* and the inverting output terminal 370*d*.

In addition, the voltage detection circuit 268 includes the operational amplifier 380, the switches 451 and 452, and the capacitors 453 and 454. In the operational amplifier 380, a common voltage is set to the reference voltage $V_{REF}$, and the operational amplifier 380 includes the inverting input terminal 380*a*, the non-inverting input terminal 380*b*, the non-inverting output terminal 380*c*, and the inverting output terminal 380*d*. The switch 451 and the capacitor 453 are connected in parallel between the inverting input terminal 380*a* and the non-inverting output terminal 380*c*. The switch 452 and the capacitor 454 are connected in parallel between the non-inverting input terminal 380*b* and the inverting output terminal 380*d*.

In the voltage detection device 201 configured as described above, the voltage detection circuit 266 can detect the voltage of the battery 394 in the following sequence.

First, when the switches 261 and 262 are in an on-state, the switches 274 and 323, and the switches 304 and 353 are turned on. According to this, the voltages $V4_p$ and $V3_p$ of the positive electrodes of the batteries 394 and 393 are applied to ends on one side of the capacitors 284 and 333, and the reference voltage $V_{REF}$ is applied to ends on the other side of the capacitors 284 and 333. That is, the capacitors 284 and 333 are charged with voltages of $(V4_p-V_{REF})$ and $(V3_p-V_{REF})$, respectively.

Next, the switches 441 and 442 and the switches 294 and 343 are switched to an on-state, and the switches 304 and 353 are switched to an off-state. When the switches 441 and 442 are turned on, the operational amplifier 370 enters a voltage follower state, and thus output voltages $V_{OP1}$ and $V_{OM1}$ become the reference voltage $V_{REF}$ (=common voltage $V_{COM}$). According to this, the capacitors 284 and 333 are charged with voltages of $(V4_p-V_{REF})$ and $(V3_p-V_{REF})$, respectively.

Next, the switches 441 and 442, and the switches 274 and 323 are switched to an off-state.

Next, the switches 404 and 414 are switched to an on-state. According to this, the voltages $V3_p$ and $V4_p$ of the positive electrodes of the batteries 393 and 394 are applied to ends on one side of the capacitors 284 and 333, and the reference voltage $V_{REF}$ is applied to ends on the other side of the capacitors 284 and 333. At this time, charges that are accumulated in the capacitors 284 and 333 are redistributed between the capacitors 443 and 444. According to this redistribution, the voltage $V_{OP1}$ that is output from the non inverting output terminal 370*c* of the operational amplifier 370, and the voltage $V_{OM1}$ output from the inverting output terminal 370*d* vary to satisfy Expression (9). That is, the voltage V4 of the battery 394 by detecting the output voltage $V_{OP1}$ and the output voltage $V_{OM1}$ of the operational amplifier 370 can be detected.

In addition, the voltage detection circuit 268 can detect the voltage of the battery 394 by performing switching of switches by using the switches 324 and 344 and the capacitor 334 which are provided on the energizing route P34, the switches 273 and 293 and the capacitor 283 which are provided on the energizing route P23, and the switches 354, 303, 424, and 434 in the same sequence as the detection of the voltage of the battery 394 by the voltage detection circuit 266.

In addition, the voltage detection circuit 266 can detect the voltage of the battery 393 by performing switching of switches by using the switches 273 and 293 and the capacitor 283 which are provided on the energizing route P23, the switches 322 and 342 and the capacitor 332 which are provided on the energizing route P32, and the switches 303, 352, 403, and 413 in the same sequence as the detection of the voltage of the battery 394 by the voltage detection circuit 266.

In addition, the voltage detection circuit 268 can detect the voltage of the battery 393 by performing switching of switches by using the switches 323 and 343 and the capacitor 333 which are provided on the energizing route P33, the switches 272 and 292 and the capacitor 282 which are provided on the energizing route P22, and switches 353, 302, 423, and 433 in the same sequence as the detection of the voltage of the battery 394 by the voltage detection circuit 266.

In the above-described embodiment, the switch 404 corresponds to a first electrode switching switch in the present disclosure, the switch 414 corresponds to a second electrode switching switch in the present disclosure, the switch 424 corresponds to a third electrode switching switch in the present disclosure, and the switch 434 corresponds to a fourth electrode switching switch in the present disclosure.

In addition, the switch 441 corresponds to the first inverting input side switch in the present disclosure, the capacitor 443 corresponds to the first inverting input side capacitor in the present disclosure, the switch 442 corresponds to the first non-inverting input side switch in the present disclosure, and the capacitor 444 corresponds to the first non-inverting input side capacitor in the present disclosure.

(Fifth Embodiment)

Hereinafter, a fifth embodiment of the present disclosure will be described with reference to the attached drawings. In addition, in the fifth embodiment, portions different from the first embodiment will be described.

Figure 8:
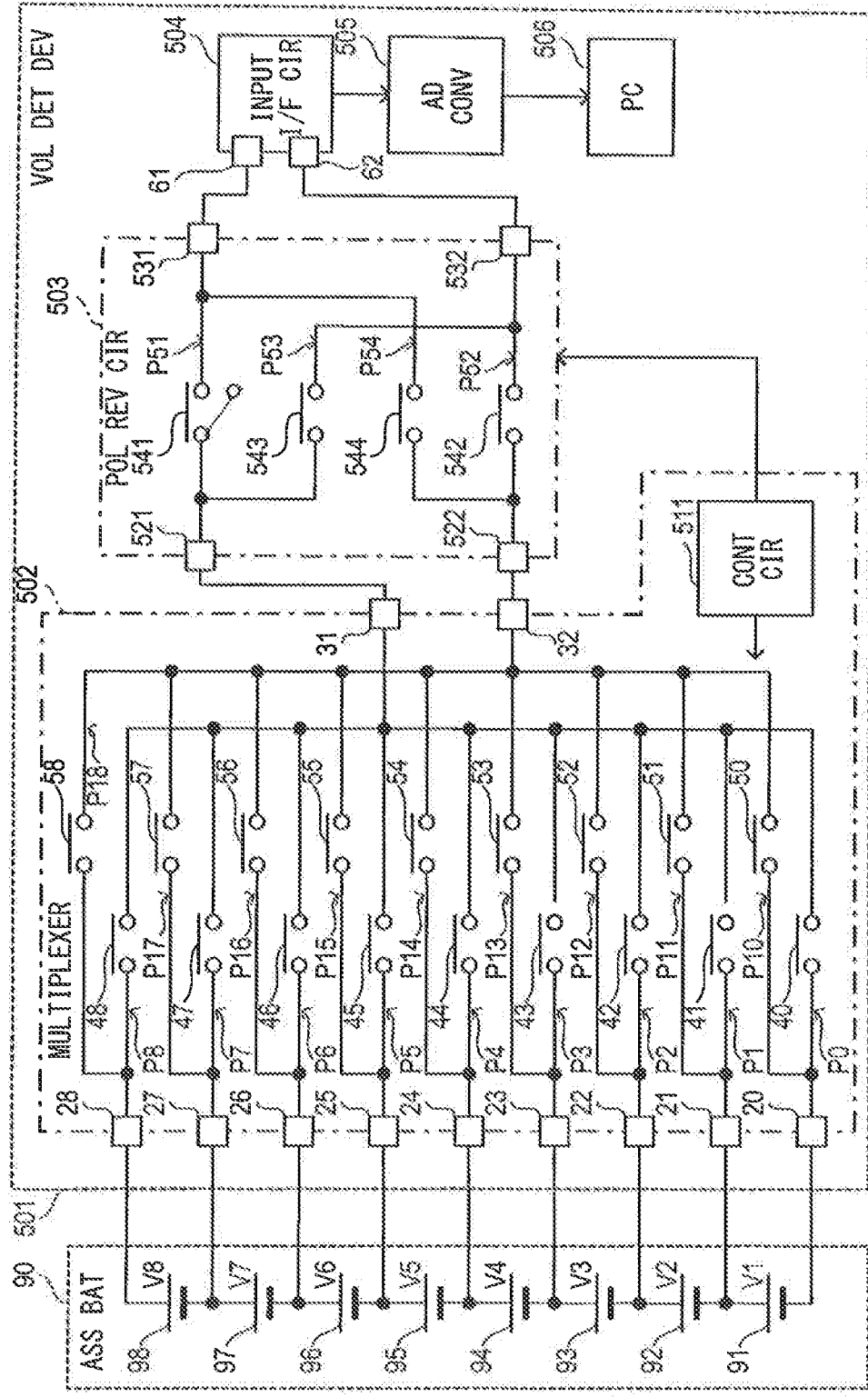
FIG. 8 is a circuit diagram illustrating a configuration of a voltage detection device of a fifth embodiment.

As shown in FIG. 8, a voltage detection device 501 of this embodiment detects a voltage of an assembled battery 90.

The voltage detection device 501 includes a multiplexer 502, a polarity inverting circuit 503, an input I/F circuit 504, an AD converter 505, and a microcomputer 506.

As is the case with the multiplexer 2 of the first embodiment, the multiplexer 502 includes energizing routes P0 to P8, energizing routes P10 to P18, voltage input terminals 20 to 28, voltage output terminals 31 and 32, switches 40 to 48, and switches 50 to 58. That is, the multiplexer 502 is different from the multiplexer 2 of the first embodiment in that the voltage output terminals 33 and 34 are omitted.

Furthermore, the multiplexer 502 includes a control circuit 511 that performs a control of switching an on-state and an off-state of the switches 40 to 48, and the switches 50 to 58, and a control of switching an on-state and an off-state of switches 541 to 544 (to be described later) of the polarity inverting circuit 503.

The polarity inverting circuit 503 includes energizing routes P51, P52, P53, and P54, voltage input terminals 521 and 522, voltage output terminals 531 and 532, and switches 541, 542, 543, and 544.

The energizing route P51 is formed to connect the voltage input terminal 521 and the voltage output terminal 531 to each other. The energizing route P52 is formed to connect the voltage input terminal 522 and the voltage output terminal 532 to each other. The energizing route P53 is formed to connect the voltage input terminal 521 and the voltage output terminal 532 to each other. The energizing route P54 is formed to connect the voltage input terminal 522 and the voltage output terminal 531 to each other.

The switches 541, 542, 543, and 544 are provided on the energizing routes P51, P52, P53, and P54, respectively, and operate to realize any state between an on-state in which the energizing routes are set up and an off-state in which the energizing routes are cut off.

The input I/F circuit 504 is a circuit which differentially amplifies signals input from the voltage output terminals 31 and 32 of the multiplexer 502 and which outputs the resultant amplified signals to the AD converter 505. As is the case with the input I/F circuit 7 of the first embodiment, the input I/F circuit 504 includes voltage input terminals 61 and 62, buffers 63 and 64, resistors 65, 66, 67, and 68, and an operational amplifier 69 (refer to FIG. 1. In FIG. 8, only the voltage input terminals 61 and 62 are illustrated).

The AD converter 505 converts a voltage value of an analog signal output from the input I/F circuit 504 to a digital signal, and outputs the digital signal to the microcomputer 506.

The microcomputer 506 is constituted by a CPU, a ROM, a RAM, an I/O, a bus line that connects these components to each other, and the like. The microcomputer 506 monitors the state of batteries 91 and 98 on the basis of the digital signal output from the AD converter 505.

Next, in the voltage detection device 501 constituted as described above, a sequence of detecting the voltage of the batteries 91 to 98 will be described.

Figure 9:
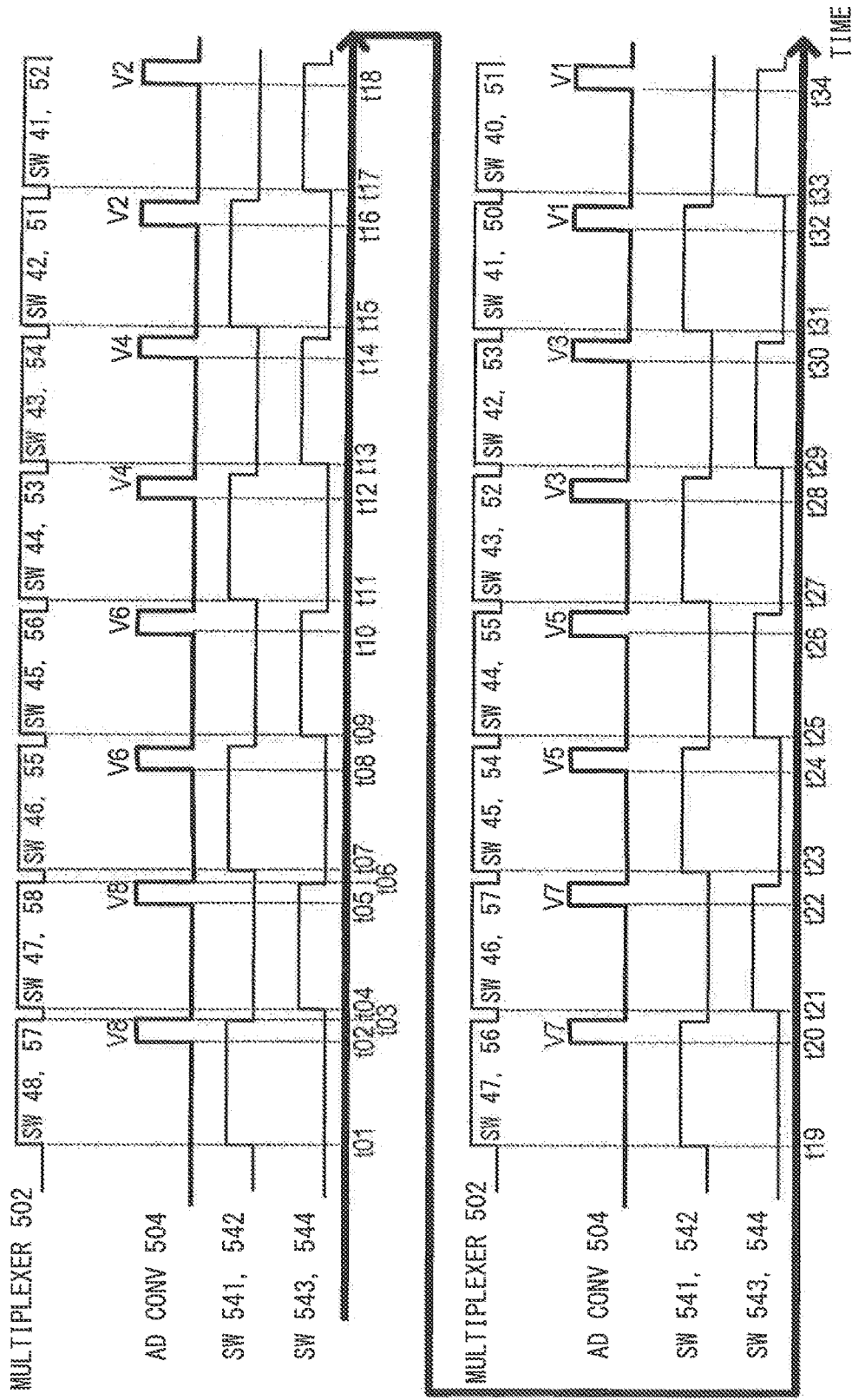
FIG. 9 is a timing chart illustrating a sequence of voltage detection carried out by the voltage detection device.

As shown in FIG. 9, first, the control circuit 511 of the multiplexer 502 turns on the switches 48 and 57, and turns on the switches 541 and 542 (refer to time t01). According to this, a voltage of a positive electrode of the battery 98 is input from the voltage output terminal 31 to the voltage input terminals 521 of the polarity inverting circuit 503 via the energizing route P8 that reaches the voltage output terminal 31 from the voltage input terminal 28 through the switch 48. In addition, a voltage of a negative electrode of the battery 98 is input from the voltage output terminal 32 to the voltage input terminal 522 of the polarity inverting circuit 503 via the energizing route P17 that reaches the voltage output terminal 32 from the voltage input terminal 27 through the switch 57.

Furthermore, the voltage of the positive electrode of the battery 98 is input from the voltage output terminal 531 to the voltage input terminal 61 of the input I/F circuit 504 via the energizing route P51 that reaches the voltage output terminal 531 from the voltage input terminal 521 of the polarity inverting circuit 503 through the switch 541. In addition, the voltage of the negative electrode of the battery 98 is input from the voltage output terminal 532 to the voltage input terminal 62 of the input I/F circuit 504 via the energizing route P52 that reaches the voltage output terminal 532 from the voltage input terminal 522 of the polarity inverting circuit 503 through the switch 542.

In addition, at this state, the microcomputer 506 acquires an output signal from the AD converter 505 (refer to time t02). According to this, the microcomputer 506 acquires information indicating a voltage V8 of the battery 98. Then, the control circuit 511 of the multiplexer 502 turns off the switches 48 and 57, and turns off the switches 541 and 542 (refer to time t03).

Next, the control circuit 511 of the multiplexer 502 turns on the switches 47 and 58, and turns on the switches 543 and 544 (refer to time t04). According to this, the voltage of the positive electrode of the battery 98 is input from the voltage output terminal 32 to the voltage input terminal 522 of the polarity inverting circuit 503 via the energizing route P18 that reaches the voltage output terminal 32 from the voltage input terminal 28 through the switch 58. In addition, the voltage of the negative electrode of the battery 98 is input from the voltage output terminal 31 to the voltage input terminal 521 of the polarity inverting circuit 503 via the energizing route P7 that reaches the voltage output terminal 31 from the voltage input terminal 27 through the switch 47.

Furthermore, the voltage of the negative electrode of the battery 98 is input from the voltage output terminal 532 to the voltage input terminal 62 of the input I/F circuit 504 via the energizing route P53 that reaches the voltage output terminal 532 from the voltage input terminal 521 of the polarity inverting circuit 503 through the switch 543. In addition, the voltage of the positive electrode of the battery 98 is input from the voltage output terminal 531 to the voltage input terminal 61 of the input I/F circuit 504 via the energizing route P54 that reaches the voltage output terminal 531 from the voltage input terminal 522 of the polarity inverting circuit 503 through the switch 544.

In addition, in this state, the microcomputer 506 acquires an output signal from the AD converter 505 (refer to time t05). According to this, the microcomputer 506 acquires information indicating a voltage V8 of the battery 98. Then, the control circuit 511 of the multiplexer 502 turns off the switches 47 and 58, and turns off the switches 543 and 544 (refer to time t06).

In this sequence, the voltage V8 of the battery 98 is detected. In addition, the same sequence executed with respect to the battery 98 is sequentially executed in the order of the battery 96, the battery 94, the battery 92, the battery 97, the battery 95, the battery 93, and the battery 91 (refer to time t07 to time t34 in FIG. 9).

The multiplexer 502 configured as described above includes the energizing routes P8 and P17 which are a pair of normal detection routes, and the energizing routes P18 and P7 which are a pair of diagnosis detection routes.

The energizing routes P8 and P17, which are a pair of normal detection routes, are provided to output the voltages of the positive electrode and the negative electrode of the battery 98. The energizing routes P18 and P7, which are a pair of diagnosis detection routes, are provided to output the voltages of the positive electrode and the negative electrode of the battery 98 to confirm the connection state of the normal detection routes by using normal detection routes that are provided to output the voltage of the battery 97.

The multiplexer 502 that is configured as described above can detect a voltage between the positive electrode and the negative electrode of the battery 98 by using the pair of normal detection routes and the pair of diagnosis detection routes. According to this, in a case where voltage detection results are different between the normal detection route and the diagnosis detection route, it can be determined that abnormality occurs in the multiplexer 502.

The energizing routes P18 and P7, which are a pair of diagnosis detection routes, are provided by using the normal detection routes that are provided to output the voltage of the battery 97. That is, the pair of diagnosis detection routes is commonly used in detection of voltages of adjacent batteries.

Accordingly, according to the multiplexer 502, the number of components that constitute the multiplexer 502 can be reduced as much as the voltage detection route that is commonly used in a case of detecting the voltage of the batteries adjacent to each other.

In addition, the multiplexer 502 includes the energizing route P16 and a control circuit 511.

The energizing route P16 is provided to output a voltage of a negative electrode of the battery 97. In addition, the control circuit 511 selects any one of a first connection state, a second connection state, and a third connection state, and switches the connection state.

The first connection state represents a state in which voltages are output from the energizing routes P8 and P17 among the energizing routes P18, P8, P17, P7, and P16, and voltages from the other energizing routes are not output. The second connection state represents a state in which voltages are output from the energizing routes P18 and P7 among the energizing routes P18, P8, P17, P7, and P16, and voltages from the other energizing routes are not output. The third connection state represents a state in which voltages are output from the energizing routes P7 and P16 among the energizing routes P18, P8, P17, P7, and P16, and voltages from the other energizing routes are not output.

According to this, the energizing route P7, which is used to detect a voltage between the positive electrode and the negative electrode of the battery 98, can be used to detect a voltage between the positive electrode and the negative electrode of the battery 97.

In addition, the voltage detection route is branched into two routes with respect to one battery electrode on the basis of the following two reasons.

As a first reason, in a case where one voltage detection route is provided with respect to one battery electrode, polarity inversion occurs in the same voltage detection route. That is, in a case of detecting a positive side voltage of a battery from the battery electrode, the polarity becomes negative, but in a case of detecting a negative side voltage of a battery that is adjacent to the battery electrode, the polarity becomes positive.

As a second reason, in a case of using a single n-type filter as illustrated in the filters 121 to 128 of the second embodiment, a filter of each battery that constitutes an assembled battery is set to an independent type.

In addition, output sides of the energizing routes P10 to P18 are connected to each other, and output sides of the energizing routes P0 to P8 are connected to each other. According to this, voltage output units of the multiplexer 502 can be integrated into at least two pieces.

In addition, the input I/F circuit 504 includes voltage input terminals 61 and 62, and outputs a voltage corresponding to a difference between a voltage input to the voltage input terminal 61 and a voltage input to the voltage input terminal 62.

The polarity inverting circuit 503 includes the voltage input terminals 521 and 522, and the voltage output terminals 531 and 532. The voltage input terminal 521 inputs voltages from ends on the other side of the energizing routes P0 to P8. The voltage input terminal 522 inputs voltages from ends on the other side of the energizing routes P10 to P18. The voltage output terminals 531 to 532 are connected to the voltage input terminals 61 and 62, respectively.

In addition, the polarity inverting circuit 503 inverts a polarity of a voltage that is output from the input I/F circuit 504 between the first connection state and the second connection state.

Specifically, in the first connection state, the polarity inverting circuit 503 connects between the voltage input terminal 521 and the voltage output terminal 531 and between the voltage input terminal 522 and a voltage output terminal 532. In addition, the polarity inverting circuit 503 does not connect between the voltage input terminal 521 and the voltage output terminal 532 and between the voltage input terminal 522 and the voltage output terminal 531. In addition, in the second connection state, the polarity inverting circuit 503 connects between the voltage input terminal 521 and the voltage output terminal 532 and between the voltage input terminal 522 and a voltage output terminal 531. In addition, the polarity inverting circuit 503 does not connect between the voltage input terminal 521 and the voltage output terminal 531 and between the voltage input terminal 522 and the voltage output terminal 532.

According to this, the voltage detection device 501 can detect a voltage with the one input I/F circuit 504 in both cases of the first connection state and the second connection state. That is, in both cases of the first connection state and the second connection state, the number of components that constitute the voltage detection device 501 can be reduced as much as the input I/F circuit and the AD converter which are commonly used in a case of detecting a voltage of a battery.

In the above-described embodiment, the multiplexer 502 corresponds to a route switching circuit in the present disclosure, and the control circuit 511 corresponds to a switching unit in the present disclosure.

In addition, the input I/F circuit 504 corresponds to a voltage detection unit in the present disclosure, the voltage input terminal 61 corresponds to a first conversion input unit in the present disclosure, and the voltage input terminal 62 corresponds to a second conversion input unit in the present disclosure.

In addition, the polarity inverting circuit 503 corresponds to a polarity inverting unit in the present disclosure, the voltage input terminal 521 corresponds to a first inverting input unit in the present disclosure, the voltage input terminal 522 corresponds to a second inverting input unit in the present disclosure, the voltage output terminal 531 corresponds to a first inverting output unit in the present disclosure, and the voltage output terminal 532 corresponds to a second inverting output unit in the present disclosure.

(Sixth Embodiment)

Hereinafter, a sixth embodiment of the present disclosure will be described with reference to the attached drawings. In addition, in the fifth embodiment, portions different from the third embodiment will be described.

Figure 10:
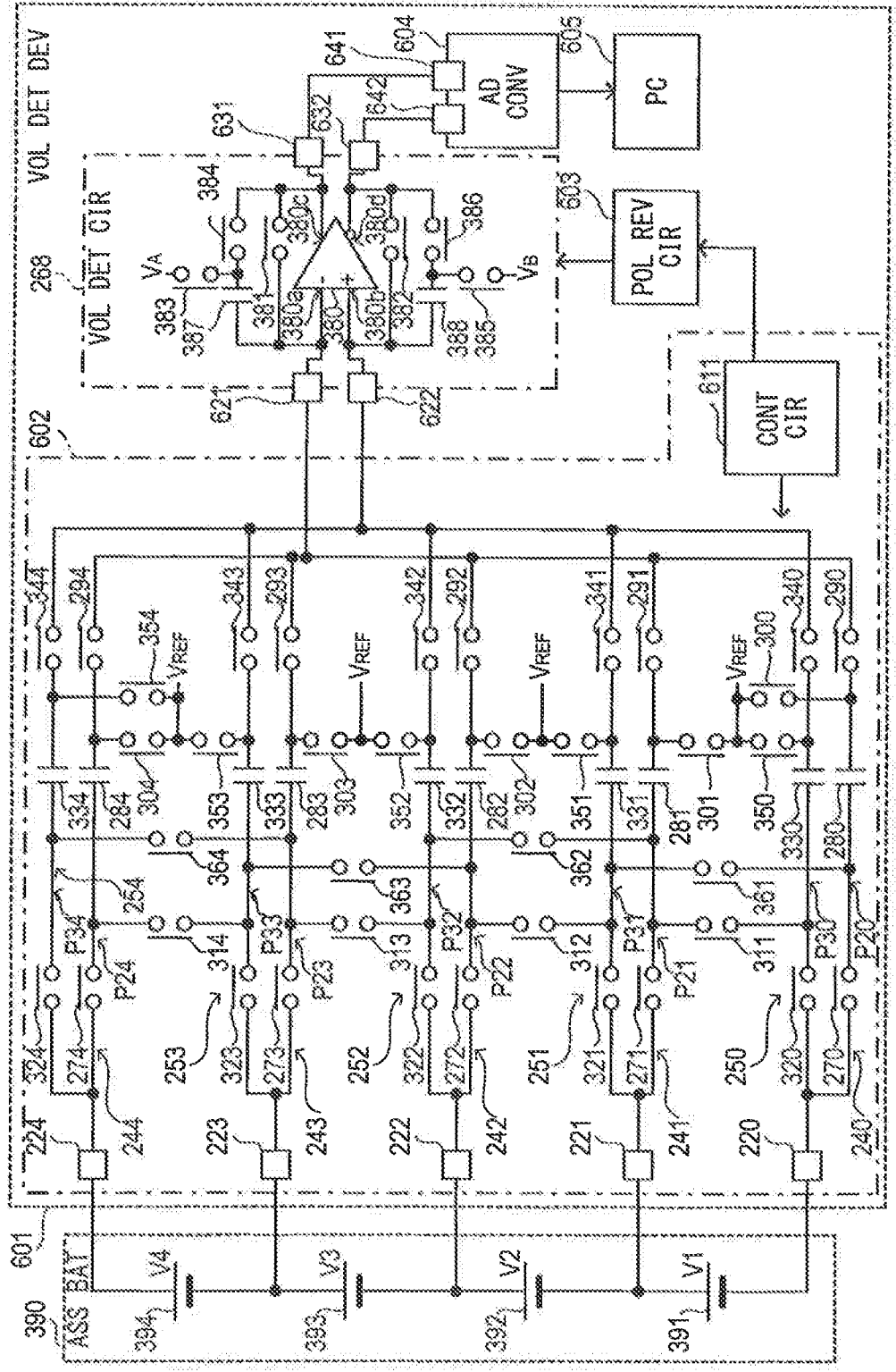
FIG. 10 is a circuit diagram illustrating a configuration of a voltage detection device of a sixth embodiment.

As shown in FIG. 10, a voltage detection device 601 of this embodiment detects a voltage of an assembled battery 390. In this embodiment, voltages of V1 to V4 of respective batteries 391 to 394 of the assembled battery 390 are set to 5 V.

The voltage detection device 601 includes a multiplexer 602, a voltage detection circuit 268, a polarity inverting circuit 603, an AD converter 604, and a microcomputer 605.

As is the case with the third embodiment, the multiplexer 602 includes energizing routes P20 to P24, energizing routes P30 to P34, voltage input terminals 220 to 224, switching circuits 240 to 244, and switching circuits 250 to 254.

Furthermore, the multiplexer 602 includes a control circuit 611 that performs a control of switching an on-state and an off-state of the switching circuits 240 to 244, and 250 to 254, and a control of switching a polarity of the voltage detection circuit 268.

The voltage detection circuit 268 is the same as the voltage detection circuit 268 of the third embodiment, and further includes voltage input terminals 621 and 622, and voltage output terminals 631 and 632. The voltage input terminal 621 is connected to the energizing routes P20 to P24 of the multiplexer 602, and the voltage input terminal 622 is connected to the energizing routes P30 to P34 of the multiplexer 602. In addition, the inverting input terminal 380a of the operational amplifier 380 is connected to the voltage input terminal 621, and the non-inverting input terminal 380b is connected to the voltage input terminal 622. In addition, the non-inverting output terminal 380c is connected to the voltage output terminal 631, and the inverting output terminal 380d is connected to the voltage output terminal 632.

Figure 11:
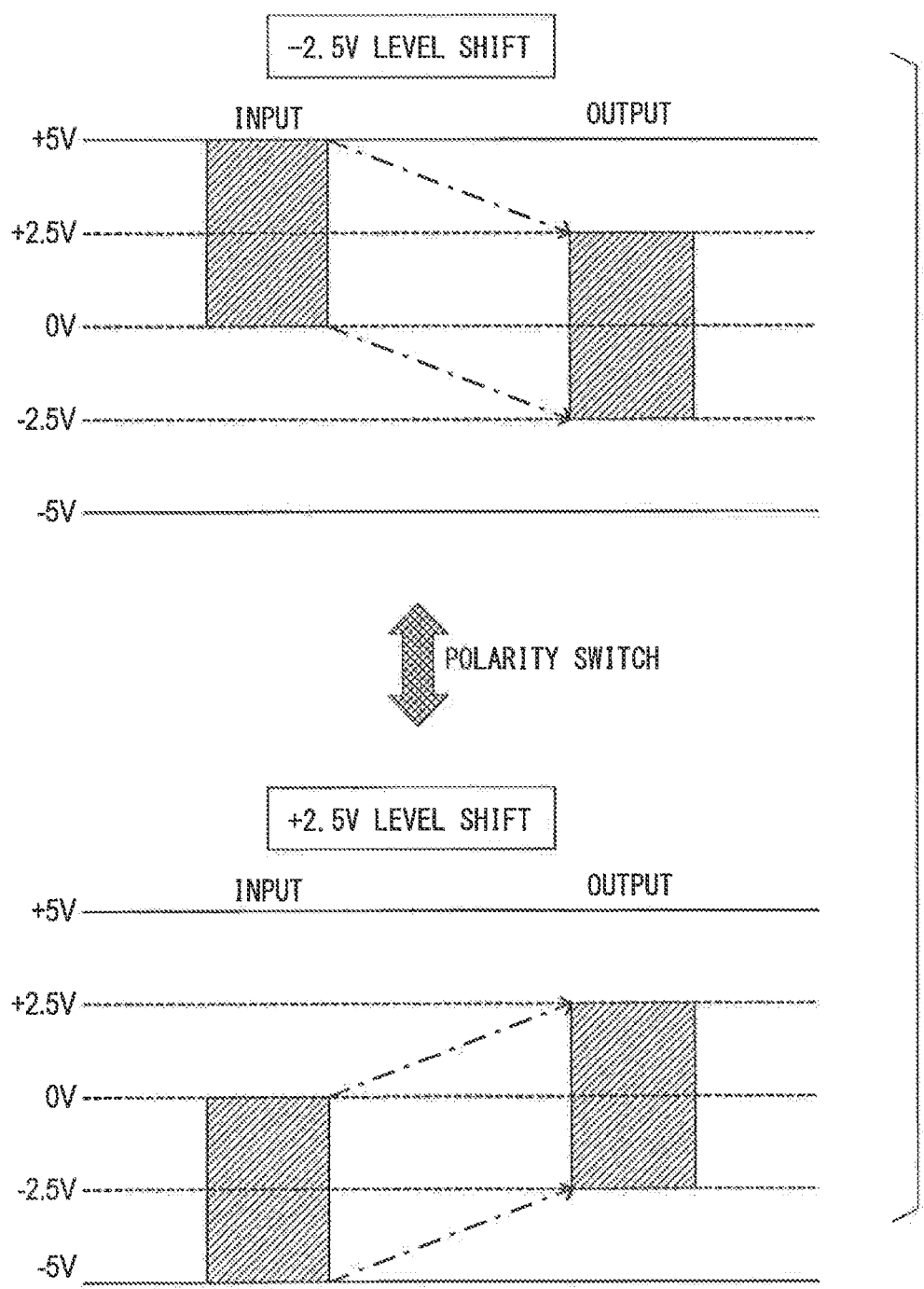
FIG. 11 is a diagram illustrating an operation of the voltage detection circuit of the sixth embodiment.

The polarity inverting circuit 603 changes a constant voltage $V_A$ and a constant voltage $V_B$ of the voltage detection circuit 268 on the basis of a command transmitted from the control circuit 611. Specifically, a positive polarity command is input from the control circuit 611, the polarity inverting circuit 603 sets the constant voltage $V_A$, for example, to 0 V, and sets the constant voltage $V_B$, for example, to 5 V. On the other hand, when a reverse polarity command is input from the control circuit 611, the polarity inverting circuit 603 sets the constant voltage $V_A$, for example, to 5 V, and sets the constant voltage $V_B$, for example, to 0 V. According to this, specifically, as shown in FIG. 11, for example, in a state in which a value of the voltage input to the voltage input terminal 621 is larger than a value of the voltage input to the voltage input terminal 622 by 5 V, the voltage detection circuit 268 shifts a voltage level of an analog signal that is generated to a negative side by 2.5 V. According to this, values of voltages output from the voltage output terminals 631 and 632 become +2.5 V and −2.5 V, respectively.

On the other hand, in a state in which the value of the voltage input to the voltage input terminal 621 is smaller than the value of the voltage input to the voltage input terminal 622 by 5 V, the voltage detection circuit 268 shifts the voltage level of the analog signal that is generated to a positive side by 2.5 V. According to this, values of voltages output from the voltage output terminals 631 and 632 become +2.5 V and −2.5 V, respectively.

In addition, in a state in which the switches 294 and 343, the switches 293 and 342, the switches 292 and 341, or the switches 291 and 340 are in an on-state, the control circuit 611 of the multiplexer 602 outputs a positive polarity command. In addition, in a state in which the switches 344 and 293, the switches 343 and 292, the switches 342 and 291, or the switches 341 and 290 are in an on-state, the control circuit 611 of the multiplexer 602 outputs a reverse polarity command.

As shown in FIG. 10, the AD converter 604 includes voltage input terminals 641 and 642. The voltage input terminals 641 and 642 are connected to the voltage output terminals 631 and 632 of the voltage detection circuit 268, respectively. In addition, the AD converter 604 converts a difference in a voltage value of analog signals output from the voltage output terminals 631 and 632 of the voltage detection circuit 268 to a digital signal, and outputs the digital signal to the microcomputer 205. In addition, in this embodiment, a voltage detection range of the AD converter 604 is −2.5 V to +2.5 V.

The microcomputer 605 is constituted by a CPU, a ROM, a RAM, an I/O, a bus line that connects these components to each other, and the like.

Furthermore, the microcomputer 605 monitors the state of the batteries 391 to 394 on the basis of the digital signal output from the AD converter 604.

The voltage detection circuit 268 of the voltage detection device 601, which is configured as described above, includes the voltage input terminals 621 and 622 which input different voltages that are output from the multiplexer 602, and outputs a voltage corresponding to a difference between a voltage input to the voltage input terminal 621 and a voltage input to the voltage input terminal 622. In addition, the voltage detection circuit 268 includes a level shifter that shifts a level of the voltage input to the voltage input terminal 621 and a level of the voltage input to the voltage input terminal 622, and outputs the voltages.

In addition, the polarity inverting circuit 603 inverts the polarity of the constant voltages $V_A$ and $V_B$, which are reference voltages, between the first connection state and the second connection state to invert the polarity of the voltage that is output from the voltage detection circuit 268.

According to this, the polarity inverting circuit 603 can detect a voltage with one voltage detection circuit 268 and one AD converter 604 in both cases of the first connection state and the second connection state. That is, in both cases of the first connection state and the second connection state, the number of components that constitute the voltage detection device 601 can be reduced as much as the voltage detection circuit and the AD converter which are commonly used in a case of detecting a voltage of a battery. Specifically, in the voltage detection device 601, one voltage detection circuit and one AD converter can be omitted in comparison to the voltage detection device 201 of the third embodiment.

In the above-described embodiment, the voltage detection circuit 268 corresponds to a voltage detection unit in the present disclosure, the voltage input terminal 621 corresponds to the first conversion input unit in the present disclosure, and the voltage input terminal 622 corresponds to the second conversion input unit in the present disclosure.

In addition, the polarity inverting circuit 603 corresponds to a polarity inverting unit in the present disclosure, and the constant voltages $V_A$ and $V_B$ correspond to the reference voltage in the present disclosure.

Hereinbefore, embodiments of the present disclosure have been described. However, the present disclosure is not limited to the above-described embodiments, and various aspects can be made in a range not departing from the technical range of the present disclosure.

For example, different configurations of the voltage detection circuits 266 and 268 are illustrated in the third embodiment and the fourth embodiment. However, in the voltage detection device 201 of the third embodiment, the voltage detection circuits 266 and 268 of the fourth embodiment may be used instead of the voltage detection circuits 266 and 268 of the third embodiment. Similarly, in the voltage detection device 201 of the fourth embodiment, the voltage detection circuits 266 and 268 of the third embodiment may be used instead of the voltage detection circuits 266 and 268 of the fourth embodiment.

Figure 12:
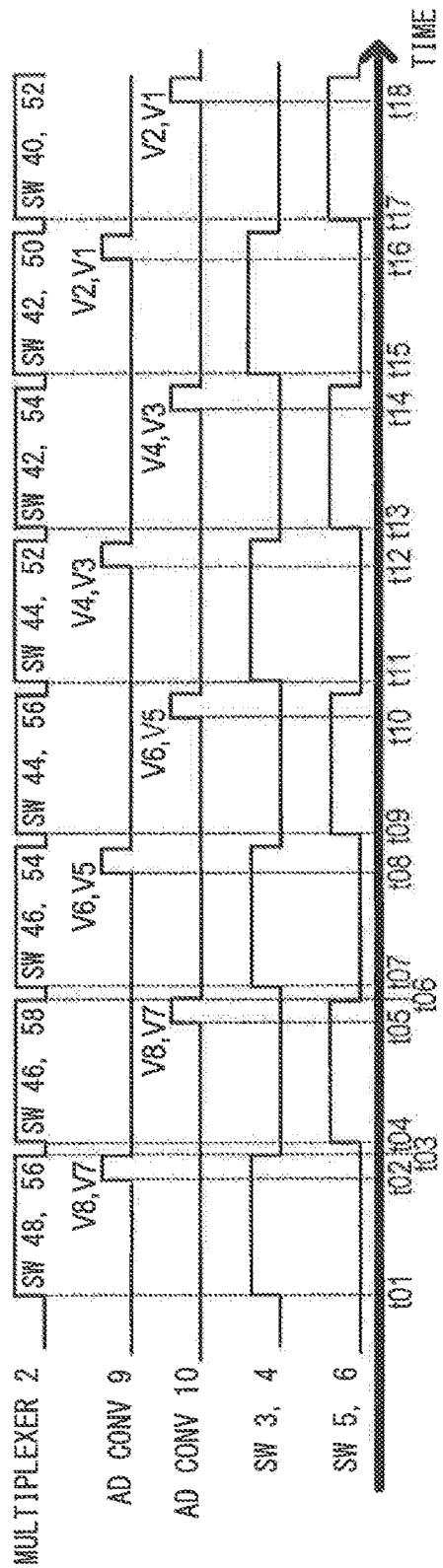
FIG. 12 is a timing chart illustrating a sequence of detecting a voltage of a plurality of batteries.

In addition, the above-described embodiments illustrate a configuration in which a voltage is detected with respect to each of the batteries 91 to 98 that constitute the assembled battery 90. However, in addition to a process of detecting a voltage of a single battery as described above, for example, as shown in FIG. 12, a process of detecting a voltage of a plurality of batteries may be performed. FIG. 12 is a diagram illustrating a sequence of detecting a voltage of a plurality of batteries in the voltage detection device 1 of the first embodiment.

As shown in FIG. 12, first, the microcomputer 11 turns on the switches 48 and 56, and the switches 3 and 4 (refer to time t01). According to this, a voltage of the positive electrode of the battery 98 is input to the input I/F circuit 7 via the energizing route P8, and a voltage of the negative electrode of the battery 97 is input to the input I/F circuit 7 via the energizing route P16. In addition, in this state, the microcomputer 11 acquires an output signal transmitted from the AD converter 9 (refer to time t02). According to this, the microcomputer 11 acquires information indicating a voltage difference (that is, a voltage (V8+V7)) between the positive electrode of the battery 98 and the negative electrode of the battery 97. Then, the switches 48 and 56, and the switches 3 and 4 are turned off (refer to time t03).

Next, the microcomputer 11 turns on the switches 46 and 58, and the switches 5 and 6 (refer to time t04). According to this, the voltage of the positive electrode of the battery 98 is input to the input I/F circuit 8 via the energizing route P18, and the voltage of the negative electrode of the battery 97 is input to the input I/F circuit 8 via the energizing route P6. In addition, in this state, the microcomputer 11 acquires an output signal transmitted from the AD converter 10 (refer to time t05). According to this, the microcomputer 11 acquires information indicating a voltage difference (that is, a voltage (V8+V7)) between the positive electrode of the battery 98 and the negative electrode of the battery 97. Then, the switches 46 and 58, and the switches 5 and 6 are turned off (refer to time t06).

The voltage (V8+V7) of the batteries 98 and 97 is detected in this sequence with both of the input I/F circuit 7 and the input I/F circuit 8. In addition, the same sequence that is executed with respect to the batteries 98 and 97 is executed with respect to the batteries 96 and 95, the batteries 94 and 93, and the batteries 92 and 91 (refer to time t07 to time t18 in FIG. 12).

In the voltage detection of the plurality of batteries, voltage detection accuracy decreases in comparison to the voltage detection of a single battery. However, in the voltage detection of the plurality of batteries, the number of times of performing voltage detection over the entirety of the batteries 91 to 98 that constitute the assembled battery 90 decreases in comparison to the voltage detection of the single battery, and thus time necessary for voltage detection can be reduced. For example, in the voltage detection of a single battery, as shown in FIG. 2, it is necessary to perform voltage detection sixteen times. On the other hand, in voltage detection of two batteries, as shown in FIG. 12, it is necessary to perform voltage detection eight times.

In addition, the energizing route P18 corresponds to the positive side diagnosis detection route in the present disclosure, the energizing route P8 corresponds to the positive side normal detection route in the present disclosure, the energizing route P16 corresponds to the negative side normal detection route in the present disclosure, and the energizing route P6 corresponds to the negative side diagnosis detection route in the present disclosure.

Figure 13:
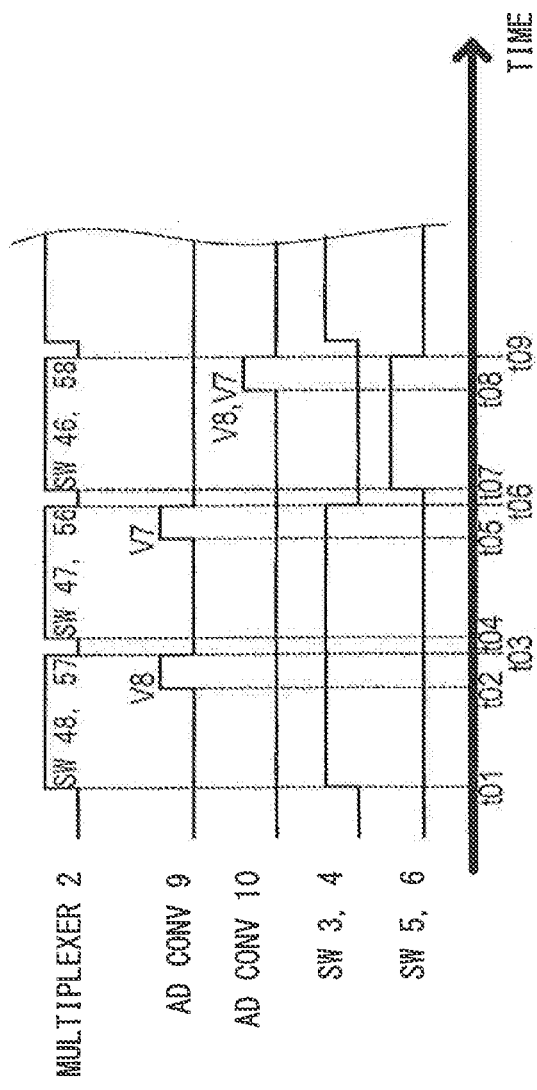
FIG. 13 is a timing chart illustrating a sequence of detecting a voltage of a plurality of batteries and a voltage of a single battery.

In addition, the above-described embodiments illustrate a configuration in which a voltage is detected with respect to each of the batteries 91 to 98 that constitute the assembled battery 90. However, in addition to a process of detecting a voltage of a single battery as described above, for example, as shown in FIG. 13, a process of detecting a voltage of a plurality of batteries and a voltage of a single battery may be performed. FIG. 13 is a diagram illustrating a sequence of detecting a voltage of a plurality of batteries and a voltage of a single battery in the voltage detection device 1 of the first embodiment.

As shown in FIG. 13, first, the microcomputer 11 turns on the switches 48 and 57, and the switches 3 and 4 (refer to time t01). According to this, a voltage of the positive electrode of the battery 98 is input to the input I/F circuit 7 via the energizing route P8, and a voltage of the negative electrode of the battery 98 is input to the input I/F circuit 7 via the energizing route P17. In addition, in this state, the microcomputer 11 acquires an output signal transmitted from the AD converter 9 (refer to time t02). According to this, the microcomputer 11 acquires information indicating the voltage V8 of the battery 98. Then, the switches 48 and 57 are turned off (refer to time t03).

Next, the microcomputer 11 turns on the switches 47 and 56 (refer to time t04). According to this, a voltage of the positive electrode of the battery 97 is input to the input I/F circuit 7 via the energizing route P7, and a voltage of the negative electrode of the battery 97 is input to the input I/F circuit 7 via the energizing route P16. In addition, in this state, the microcomputer 11 acquires an output signal transmitted from the AD converter 9 (refer to time t05). According to this, the microcomputer 11 acquires information indicating the voltage V7 of the battery 97. Then, the switches 47 and 56, and the switches 3 and 4 are turned off (refer to time t06).

Furthermore, the microcomputer 11 turns on the switches 46 and 58, and the switches 5 and 6 (refer to time t07). The voltage of the positive electrode of the battery 98 is input to the input I/F circuit 8 via the energizing route P18, and the voltage of the negative electrode of the battery 97 is input to the input I/F circuit 8 via the energizing route P6. In addition, in this state, the microcomputer 11 acquires an output signal transmitted from the AD converter 10 (refer to time t08). According to this, the microcomputer 11 acquires information indicating a voltage difference (that is, a voltage (V8+V7)) between the positive electrode of the battery 98 and the negative electrode of the battery 97. Then, the switches 46 and 58, and the switches 5 and 6 are turned off (refer to time t09).

In this sequence, the voltage of the plurality of batteries 98 and 97, and the voltage of the single battery 98, and the voltage of the single battery 97 are detected. In addition, the same sequence that is executed with respect to the batteries 98 and 97 is executed with respect to the batteries 96 and 95, the batteries 94 and 93, and the batteries 92 and 91.

In the voltage detection of the plurality of batteries, voltage detection accuracy decreases in comparison to the voltage detection of a single battery. However, in the voltage detection of the plurality of batteries, the number of times of performing voltage detection over the entirety of the batteries 91 to 98 that constitute the assembled battery 90 decreases in comparison to the voltage detection of the single battery, and thus time necessary for voltage detection can be reduced.

In addition, the energizing route P16 corresponds to the adjacent normal detection route in the present disclosure, and the energizing route P6 corresponds to the adjacent diagnosis detection route in the present disclosure.

Figure 14:
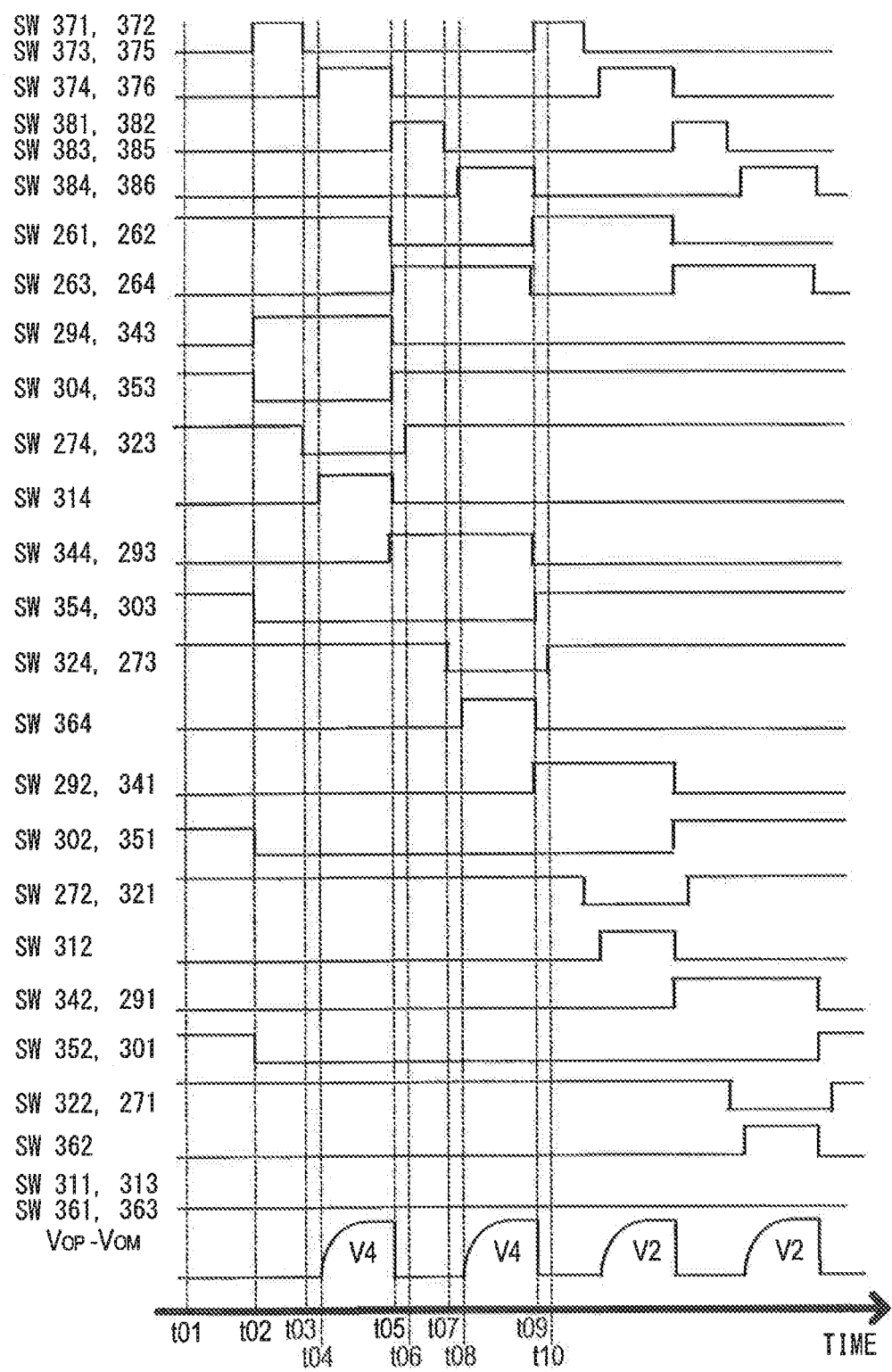
FIG. 14 is a timing chart illustrating another sequence of the voltage detection carried out by the voltage detection device of the third embodiment.

In addition, in the third embodiment, as shown in FIG. 14, the switches 354 and 303, the switches 302 and 351, and the switches 352 and 301 may be additionally turned off at time t02. According to this, the capacitors 280, 281, 282, 283, and 284, and the capacitors 330, 331, 332, 333, and 334 can be simultaneously charged.

Figure 15:
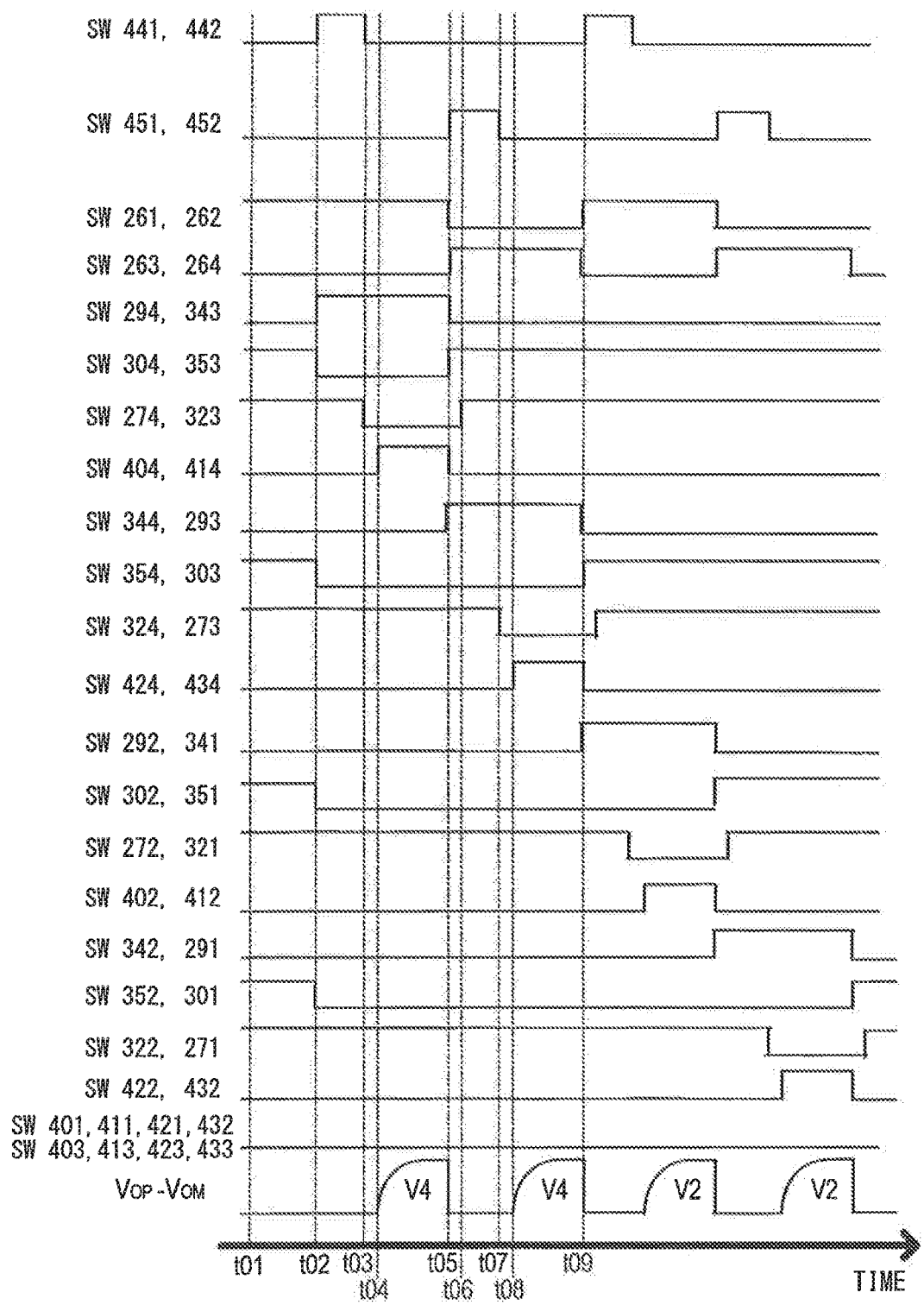
FIG. 15 is a timing chart illustrating another sequence of the voltage detection carried out by the voltage detection device of the fourth embodiment.

In addition, in the fourth embodiment, as shown in FIG. 15, the switches 354 and 303, the switches 302 and 351, the switches 352 and 301, and the switches 350 and 300 may be additionally turned off at time t02. According to this, the capacitors 280, 281, 282, 283, and 284, and the capacitors 330, 331, 332, 333, and 334 can be simultaneously charged.

Figure 16:
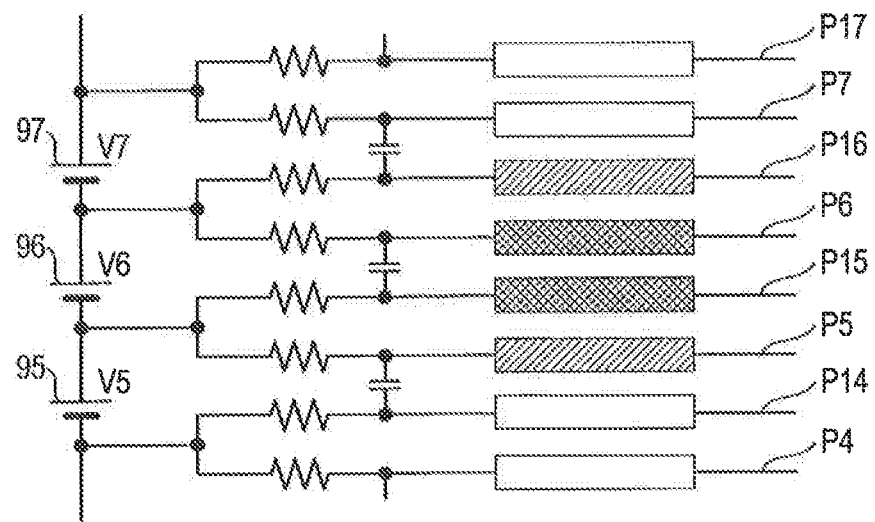
FIG. 16 is a circuit diagram illustrating a first method of selecting a normal detection route and a diagnosis detection route in voltage detection of a single battery.
Figure 17:
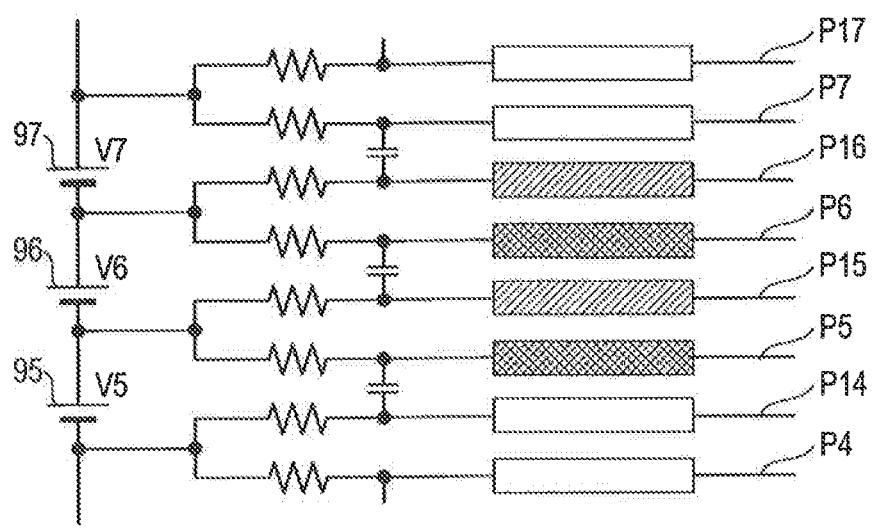
FIG. 17 is a circuit diagram illustrating a second method of selecting the normal detection route and the diagnosis detection route in the voltage detection of the single battery.
Figure 18:
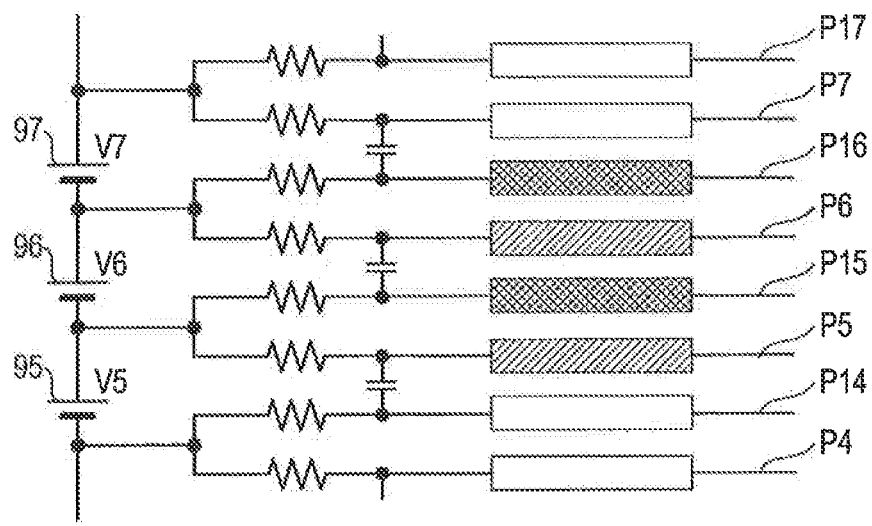
FIG. 18 is a circuit diagram illustrating a third method of selecting the normal detection route and the diagnosis detection route in the voltage detection of the single battery.

In addition, for example, as shown in FIG. 16, the above-described first and second embodiments illustrate a configuration in which the energizing routes P6 and P15 are set as the normal detection routes, and the energizing routes P16 and P5 are set as the diagnosis detection routes. However, in a case where output sides of the energizing routes P0 to P8 are not electrically connected to each other, and output sides of the energizing routes P10 to P18 are not electrically connected to each other, for example, as shown in FIG. 17, the energizing routes P6 and P5 may be set as the normal detection routes, and the energizing routes P16 and P15 may be set as the diagnosis detection routes. In addition, for example, as shown in FIG. 18, the energizing routes P16 and P15 may be set as the normal detection routes, and the energizing routes P6 and P5 may be set as the diagnosis detection routes.

Figure 19:
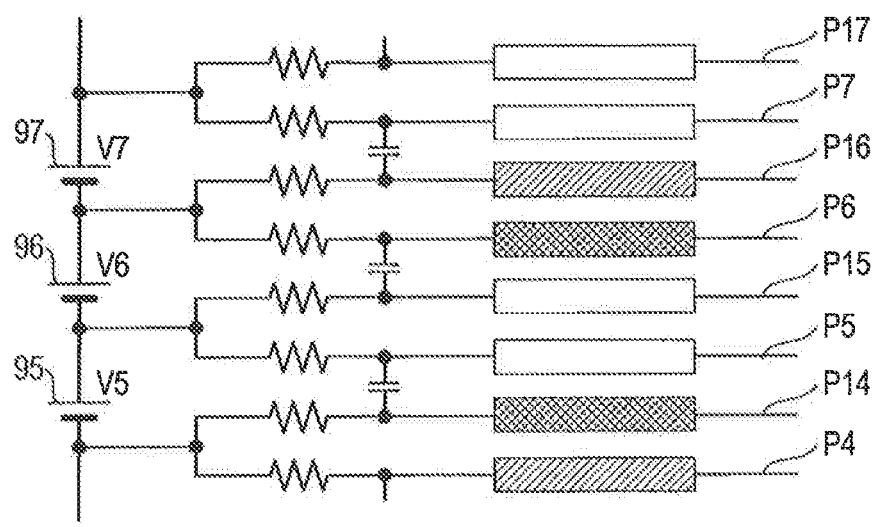
FIG. 19 is a circuit diagram illustrating a first method of selecting a normal detection route and a diagnosis detection route in voltage detection of a plurality of batteries.
Figure 20:
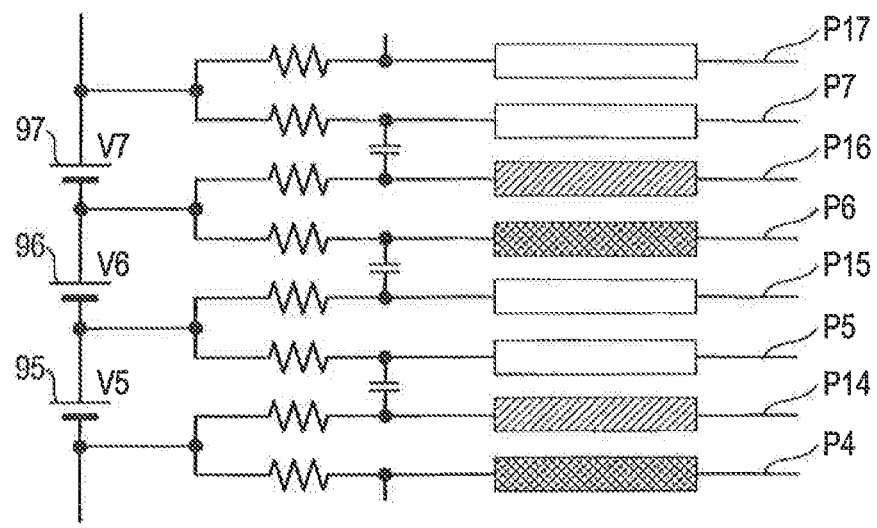
FIG. 20 is a circuit diagram illustrating a second method of selecting the normal detection route and the diagnosis detection route in the voltage detection of the plurality of batteries.
Figure 21:
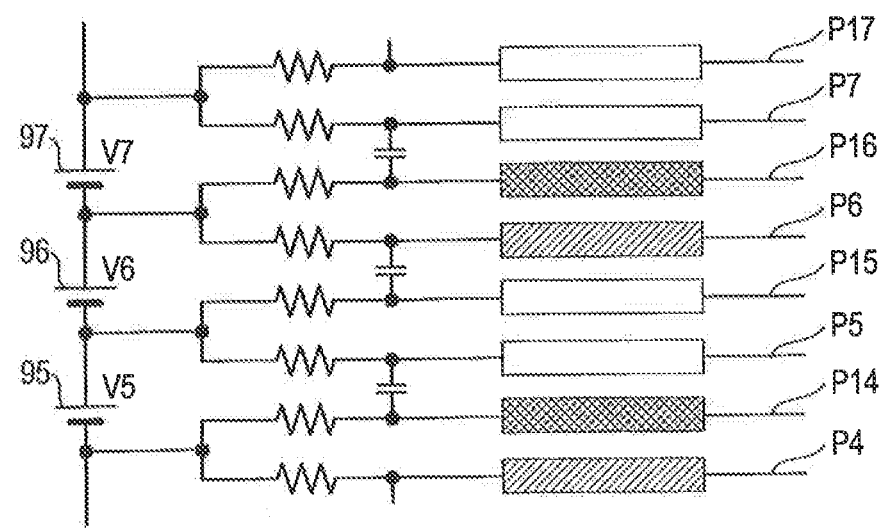
FIG. 21 is a circuit diagram illustrating a third method of selecting the normal detection route and the diagnosis detection route in the voltage detection of the plurality of batteries.

In addition, in a case where the output sides of the energizing routes P0 to P8 are not electrically connected to each other, and the output sides of the energizing routes P10 to P18 are not electrically connected to each other, when detecting a voltage of a plurality of batteries, for example, as shown in FIGS. 19, 20, and 21, the normal detection route and the diagnosis detection route may be selected.

In FIG. 19, the energizing routes P6 and P14 are set as the normal detection routes, and the energizing routes P16 and P4 are set as the diagnosis detection routes. In FIG. 20, the energizing routes P6 and P4 are set as the normal detection routes, and the energizing routes P16 and P14 are set as the diagnosis detection routes. In FIG. 21, the energizing routes P16 and P14 are set as the normal detection routes, and the energizing routes P6 and P4 are set as the diagnosis detection routes.

In addition, a function of one constituent element in the above-described embodiments may be distributed to a plurality of constituent elements, or functions of a plurality of constituent elements may be integrated into one constituent element. In addition, at least a part of the configurations of the above-described embodiments may be substituted with a known configuration having the same function. In addition, a part of the configurations of the above-described embodiments may be omitted as long as the problem can be solved. In addition, at least a part of the configurations of the above-described embodiments may be added to or substituted with the configurations of the other embodiments. In addition, all aspects that are included in the technical spirit that is specified in the attached claims are embodiments of the present disclosure.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A route switching circuit comprising:
   a plurality of switches that include a plurality of input terminals electrically connected to a plurality of batteries and a plurality of output terminals;
   a pair of normal detection routes that extend between the input terminals and the output terminals of the plurality of switches, the pair of normal detection routes includes
      a positive-terminal normal detection route that outputs a node voltage from a positive terminal of one or more batteries in the plurality of batteries; and
      a negative-terminal normal detection route that outputs a node voltage from a negative terminal of the one or more batteries in the plurality of batteries; and
   an adjacent normal detection route that outputs a node voltage of a negative terminal of an adjacent battery subsequently connected in series to the one or more batteries, the adjacent normal detection route being different from both of the pair of normal detection routes; and
   a pair of diagnosis detection routes that extend between the input terminals and the output terminals of the plurality of switches, that each share a common node with the pair of normal detection routes, that are different from the pair of normal detection routes and the adjacent normal detection route, and that confirm a connection state of the normal detection routes by comparison with the node voltage determined via the normal detection routes, the pair of diagnosis detection routes include
      a positive-terminal diagnosis detection route that outputs the node voltage from the positive terminal of one or more batteries in the plurality of batteries, and
      a negative-terminal diagnosis detection route that outputs the node voltage from the negative terminal of one or more batteries in the plurality of batteries and a positive terminal from the adjacent battery subsequently connected in series to the one or more batteries; and
   a switching unit that is operatively connected to the plurality of switches, that is configured to selectively turn ON and turn OFF each of the plurality of switches to form different closed circuits according to different connection states, and that is further configured to
      set a first connection state to form a closed circuit in which voltages are output from the positive-terminal normal detection route and the negative-terminal normal detection route and an open circuit in which a voltage is not output from the positive-terminal diagnosis detection route, the negative-terminal diagnosis detection route, and the adjacent normal detection route,
      set a second connection state to form a closed circuit in which voltages are output from the positive-terminal diagnosis detection route and the negative-terminal diagnosis detection route and an open circuit in which a voltage is not output from the positive-terminal normal detection route, the negative-terminal normal detection route, and the adjacent normal detection route, and
      set a third connection state to form a closed circuit in which voltages are output from the negative-terminal diagnosis detection route and the adjacent normal detection route and an open circuit in which a voltage is not output from the positive-terminal diagnosis detection route, the positive-terminal normal detection route, and the negative-terminal normal detection route, wherein
   the switching unit sets the second connection state after the first connection state and sets the third connection state after the second connection state.

2. The route switching circuit according to claim 1, further comprising:
   an adjacent diagnosis detection route that outputs the node voltage of the negative terminal of the adjacent battery subsequently connected in series to the one or more batteries,
   wherein the switching unit further selects any one of the first connection state, a fifth connection state, and a sixth connection state, and switches the connection state, wherein a connection state, in which voltages are output from the positive-terminal diagnosis detection route and the adjacent diagnosis detection route, and a voltage is not output from the positive-terminal normal detection route, the negative-terminal normal detection route, the negative-terminal diagnosis detection route and the adjacent normal detection route, is set as the fifth connection state, and wherein a connection state, in which voltages are output from the negative-terminal diagnosis detection route and the adjacent normal detection route, and a voltage is not output from the positive-terminal diagnosis detection route, the positive-terminal normal detection route, the negative-terminal normal detection route and the adjacent diagnosis detection route, is set as the sixth connection state.

3. The route switching circuit according to claim 1, wherein
the route switching circuit is a microcomputer that is configured to selectively turn ON and turn OFF each of the plurality of switches to form different closed circuits according to different connection states.

4. The route switching circuit according to claim 1, wherein
the adjacent battery is adjacent to the one or more batteries detected by the pair of normal detection routes.

5. The route switching circuit according to claim 1, wherein
each of the pair of diagnosis detection routes and each of the pair of normal detection routes respectively branch from the common node shared between each of the pair of diagnosis detection routes and the pair of normal detection routes.

6. The route switching circuit according to claim 5, wherein
each of the pair of diagnosis detection routes and each of the pair of normal detection routes share a common node and each of the pair of diagnosis detection routes and each of the pair of normal detection routes have a different path.

7. The route switching circuit according to claim 1, wherein
each of the pair of diagnosis detection routes and each of the pair of normal detection routes share a common node and each of the pair of diagnosis detection routes and each of the pair of normal detection routes have a different path.

8. The route switching circuit according to claim 1, wherein
the switching unit includes a microcomputer.

9. The route switching circuit according to claim 1, wherein an output side of the positive-terminal diagnosis detection route, an output side of the negative-terminal normal detection route, and an output side of the adjacent normal detection route are connected to each other, and
wherein an output side of the positive-terminal normal detection route and an output side of the negative-terminal diagnosis detection route are connected to each other.

10. The route switching circuit according to claim 9, wherein the plurality of switches includes
a positive-terminal diagnosis route switch which is arranged on the positive-terminal diagnosis detection route;
a positive-terminal normal route switch which is arranged on the positive-terminal normal detection route;
a negative-terminal normal route switch which is arranged on the negative-terminal normal detection route;
a negative-terminal diagnosis route switch which is arranged on the negative-terminal diagnosis detection route; and
an adjacent normal route switch which is arranged on the adjacent normal detection route,
wherein, in the first connection state, the switching unit turns on the positive-terminal normal route switch and the negative-terminal normal route switch, and turns off the positive-terminal diagnosis route switch, the negative-terminal diagnosis route switch, and the adjacent normal route switch,
wherein, in the second connection state, the switching unit turns on the positive-terminal diagnosis route switch and the negative-terminal diagnosis route switch, and turns off the positive-terminal normal route switch, the negative-terminal normal route switch and the adjacent normal route switch, and
wherein, in the third connection state, the switching unit turns on the negative-terminal diagnosis route switch and the adjacent side normal route switch, and turns off the positive-terminal diagnosis route switch, the positive-terminal normal route switch and the negative-terminal normal route switch.

11. A voltage detection device comprising:
the route switching circuit according to claim 9;
a voltage detection unit including a first conversion input unit and a second conversion input unit, in each of which different voltages output from the route switching circuit are input, respectively, and outputting a voltage corresponding to a difference between a voltage input to the first conversion input unit and a voltage input to the second conversion input unit; and
a polarity inverting unit that inverts a polarity of a voltage output from the voltage detection unit between the first connection state and the second connection state.

12. The voltage detection device according to claim 11, wherein the polarity inverting unit includes:
a first inverting input unit, to which voltages output from the positive-terminal normal detection route and the negative-terminal diagnosis detection route are input;
a second inverting input unit, to which voltages output from the positive-terminal diagnosis detection route, the negative-terminal normal detection route and the adjacent normal detection route are input;
a first inverting output unit that is connected to the first conversion input unit; and
a second inverting output unit that is connected to the second conversion input unit,
wherein, in the first connection state, a connection between the first inverting input unit and the first inverting output unit is established, and a connection between the second inverting input unit and the second inverting output unit is established, and a connection between the first inverting input unit and the second inverting output unit is not established, and a connection between the second inverting input unit and the first inverting output unit is not established, and
wherein, in the second connection state, a connection between the first inverting input unit and the second inverting output unit is established, and a connection between the second inverting input unit and the first inverting output unit is established, and a connection between the first inverting input unit and the first inverting output unit is not established, and a connection between the second inverting input unit and the second inverting output unit is not established, so that a polarity of a voltage output from the voltage detection unit is inverted.

13. The voltage detection device according to claim 11, wherein the voltage detection unit includes a level shifter that shifts a level of the voltage input to the first conversion input unit and a level of the voltage input to the second conversion input unit, and outputs shifted voltages, and
wherein the polarity inverting unit inverts a polarity of a reference voltage input to the level shifter between the first connection state and the second connection state, so that the polarity of the voltage output from the voltage detection unit is inverted.

14. The voltage detection device according to claim 11, wherein the route switching circuit includes:
   a positive-terminal diagnosis route capacitor, which is arranged on the positive-terminal diagnosis detection route between the common node being a positive-terminal connection point and the positive-terminal diagnosis route switch;
   a positive-terminal normal route capacitor, which is arranged on the positive-terminal normal detection route between the positive-terminal connection point and the positive-terminal normal route switch;
   a negative-terminal normal route switch, which is arranged on the negative-terminal normal detection route between the common node being a negative-terminal connection point and the negative-terminal normal route switch;
   a negative-terminal diagnosis route switch, which is arranged on the negative-terminal diagnosis detection route between the negative-terminal connection point and the negative-terminal diagnosis route switch;
   a first battery side switch, which is arranged on the positive-terminal diagnosis detection route between the positive-terminal connection point and the positive-terminal diagnosis route capacitor;
   a second battery side switch, which is arranged on the positive-terminal normal detection route between the positive-terminal connection point and the positive-terminal normal route capacitor;
   a third battery side switch, which is arranged on the negative-terminal normal detection route between the negative-terminal connection point and the negative-terminal normal route capacitor;
   a fourth battery side switch, which is arranged on the negative-terminal diagnosis detection route between the negative-terminal connection point and the negative-terminal diagnosis route capacitor;
   a first inter-route switch, which has one end connected to a connection point between the positive-terminal normal route capacitor and the second battery side switch and the other end connected to a connection point between the negative-terminal normal route capacitor and the third battery side switch;
   a second inter-route switch, which has one end connected to a connection point between the positive-terminal diagnosis route capacitor and the first battery side switch and the other end connected to a connection point between the negative-terminal diagnosis route capacitor and the fourth battery side switch;
   a first reference voltage switch, which has one end connected to a connection point between the positive-terminal diagnosis route capacitor and the positive-terminal diagnosis route switch and the other end, to which a reference voltage that is set in advance is applied;
   a second reference voltage switch, which has one end connected to a connection point between the positive-terminal normal route capacitor and the positive-terminal normal route switch and the other end, to which the reference voltage is applied;
   a third reference voltage switch, which has one end connected to a connection point between the negative-terminal normal route capacitor and the negative-terminal normal route switch and the other end, to which the reference voltage is applied; and
   a fourth reference voltage switch, which has one end connected to a connection point between the negative-terminal diagnosis route capacitor and the negative-terminal diagnosis route switch and the other end, to which the reference voltage is applied, and
wherein the voltage detection unit includes:
   a first operational amplifier, which has a common voltage set as the reference voltage, and includes a first inverting input terminal, a first non-inverting input terminal, a first non-inverting output terminal and a first inverting output terminal;
   a first inverting input side switch and a first inverting input side capacitor, which are connected in parallel between the first inverting input terminal and the first non-inverting output terminal; and
   a first non-inverting input side switch and a first non-inverting input side capacitor, which are connected in parallel between the first non-inverting input terminal and the first inverting output terminal.

15. The voltage detection device according to claim 11, wherein the route switching circuit includes:
   a positive-terminal diagnosis route capacitor, which is arranged on the positive-terminal diagnosis detection route between the common node being a positive-terminal connection point and the positive-terminal diagnosis route switch;
   a positive-terminal normal route capacitor, which is arranged on the positive-terminal normal detection route between the positive-terminal connection point and the positive-terminal normal route switch;
   a negative-terminal normal route capacitor, which is arranged on the negative-terminal normal detection route between the common node being a negative-terminal connection point and the negative-terminal normal route switch;
   a negative-terminal diagnosis route capacitor, which is arranged on the negative-terminal diagnosis detection route between the negative-terminal connection point and the negative-terminal diagnosis route switch;
   a first battery side switch, which is arranged on the positive-terminal diagnosis detection route between the positive-terminal connection point and the positive-terminal diagnosis route capacitor;
   a second battery side switch, which is arranged on the positive-terminal normal detection route between the positive-terminal connection point and the positive-terminal normal route capacitor;
   a third battery side switch, which is arranged on the negative-terminal normal detection route between the negative-terminal connection point and the negative-terminal normal route capacitor;

a fourth battery side switch, which is arranged on the negative-terminal diagnosis detection route between the negative-terminal connection point and the negative-terminal diagnosis route capacitor;

a first electrode switching switch, which has one end connected to the connection point between the positive-terminal normal route capacitor and the second battery side switch and the other end connected to a connection point between the negative-terminal connection point and the third battery side switch;

a second electrode switching switch, which has one end connected to a connection point between the negative-terminal normal route capacitor and the third battery side switch and the other end connected to a connection point between the positive-terminal connection point and the second battery side switch;

a third electrode switching switch, which has one end connected to a connection point between the positive-terminal diagnosis route capacitor and the first battery side switch and the other end connected to a connection point between the negative-terminal connection point and the fourth battery side switch;

a fourth electrode switching switch, which has one end connected to a connection point between the negative-terminal diagnosis route capacitor and the fourth battery side switch and the other end connected to a connection point between the positive-terminal connection point and the first battery side switch;

a first reference voltage switch, which has one end connected to a connection point between the positive-terminal diagnosis route capacitor and the positive-terminal diagnosis route switch and the other end, to which a reference voltage that is set in advance is applied;

a second reference voltage switch, which has one end connected to a connection point between the positive-terminal normal route capacitor and the positive-terminal normal route switch and the other end, to which the reference voltage is applied;

a third reference voltage switch, which has one end connected to a connection point between the negative-terminal normal route capacitor and the negative-terminal normal route switch and the other end, to which the reference voltage is applied; and a fourth reference voltage switch, which has one end connected to a connection point between the negative-terminal diagnosis route capacitor and the negative-terminal diagnosis route switch and the other end, to which the reference voltage is applied, and wherein the voltage detection unit includes:

a first operational amplifier, which has a common voltage set as the reference voltage, and includes a first inverting input terminal, a first non-inverting input terminal, a first non-inverting output terminal, and a first inverting output terminal;

a first inverting input side switch and a first inverting input side capacitor, which are connected in parallel between the first inverting input terminal and the first non-inverting output terminal; and a first non-inverting input side switch and a first non-inverting input side capacitor, which are connected in parallel between the first non-inverting input terminal and the first inverting output terminal.

\* \* \* \* \*